United States Patent
Kuribayashi et al.

(10) Patent No.: US 11,814,725 B2
(45) Date of Patent: Nov. 14, 2023

(54) METHOD OF CLEANING, METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Koei Kuribayashi, Toyama (JP); Takeo Hanashima, Toyama (JP); Hiroyuki Miyagishi, Toyama (JP); Hiroto Yamagishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/431,339

(22) Filed: Jun. 4, 2019

(65) Prior Publication Data
US 2019/0368036 A1 Dec. 5, 2019

(30) Foreign Application Priority Data

Jun. 4, 2018 (JP) .................................. 2018-107168

(51) Int. Cl.
*C23C 16/44* (2006.01)
*H01L 21/02* (2006.01)

(52) U.S. Cl.
CPC ...... *C23C 16/4405* (2013.01); *H01L 21/0217* (2013.01)

(58) Field of Classification Search
CPC .......... C23C 16/4405; C23C 16/45523; C23C 16/00–56; H01L 21/00–86
See application file for complete search history.

(56) References Cited

U.S. PATENT DOCUMENTS

| | | | |
|---|---|---|---|
| 5,609,721 A * | 3/1997 | Tsukune | C23C 16/45561 216/58 |
| 6,544,345 B1 | 4/2003 | Mayer et al. | |
| 2005/0108892 A1 | 5/2005 | Wu et al. | |
| 2008/0105194 A1* | 5/2008 | Nakao | B08B 9/027 134/22.12 |

(Continued)

FOREIGN PATENT DOCUMENTS

| | | |
|---|---|---|
| JP | 2004-197128 A | 7/2004 |
| JP | 2012-019194 A | 1/2012 |

(Continued)

OTHER PUBLICATIONS

Singaporean Search Report dated Jan. 17, 2020 for the Singaporean Patent Application No. 10201905090R.

(Continued)

*Primary Examiner* — Mikhail Kornakov
*Assistant Examiner* — Richard Z. Zhang
(74) *Attorney, Agent, or Firm* — Volpe Koenig

(57) ABSTRACT

There is provided a technique of cleaning an interior of a supply part by performing a cycle a predetermined number of times, the cycle including: (a) supplying a first gas, which is one of a cleaning gas and an additive gas that reacts with the cleaning gas, from the supply part toward an interior of a process container in which a substrate has been processed by supplying a processing gas from the supply part to the substrate; and (b) supplying a second gas, which is the other one of the cleaning gas and the additive gas and is different from the first gas, from the supply part toward the interior of the process container in a state in which a part of the first gas remains in the supply part after supply of the first gas is stopped.

20 Claims, 10 Drawing Sheets

(56) References Cited

U.S. PATENT DOCUMENTS

| | | | |
|---|---|---|---|
| 2009/0305517 A1* | 12/2009 | Nakashima | C23C 16/4405 118/724 |
| 2010/0167541 A1* | 7/2010 | Kato | H01L 21/02255 438/680 |
| 2011/0318937 A1* | 12/2011 | Akae | H01L 21/0228 438/758 |
| 2013/0065402 A1* | 3/2013 | Kameda | C23C 16/4405 438/758 |
| 2013/0102161 A1* | 4/2013 | Asai | C23C 16/4405 438/791 |
| 2014/0287594 A1 | 9/2014 | Terasaki et al. | |
| 2015/0000695 A1 | 1/2015 | Noda et al. | |
| 2015/0031216 A1* | 1/2015 | Akae | C23C 16/4405 438/763 |
| 2015/0232986 A1 | 8/2015 | Kameda et al. | |
| 2016/0244875 A1* | 8/2016 | Sasajima | C23C 16/45578 |
| 2017/0087606 A1* | 3/2017 | Nakamura | C23C 16/4408 |
| 2018/0057936 A1* | 3/2018 | Kameda | C23C 16/4405 |

FOREIGN PATENT DOCUMENTS

| | | |
|---|---|---|
| JP | 2013-179239 A | 9/2013 |
| JP | 2015-012198 A | 1/2015 |
| JP | 2015-153956 A | 8/2015 |
| KR | 20130043574 A | 4/2013 |
| KR | 20140116815 A | 10/2014 |
| TW | 201705285 A | 2/2017 |
| WO | WO-2016140166 A1 * | 9/2016 ....... C23C 16/45523 |

OTHER PUBLICATIONS

Singaporean Written Opinion dated Jan. 22, 2020 for the Singaporean Patent Application No. 10201905090R.

Korean Office Action dated May 29, 2020 for the Korean Patent Application No. 10-2019-0065375.

Japanese Office Action dated Jul. 14, 2020 for Japanese Patent Application No. 2018-107168.

Singapore Written Opinion dated Nov. 23, 2020 for Singapore Patent Application No. 10201905090R.

Chinese Office Action dated Mar. 12, 2021 for Chinese Patent Application No. 201910480257.4.

Chinese Search Report dated Mar. 12, 2021 for Chinese Patent Application No. 201910480257.4.

Japanese Office Action dated Oct. 13, 2020 for Japanese Patent Application No. 2018-107168.

* cited by examiner

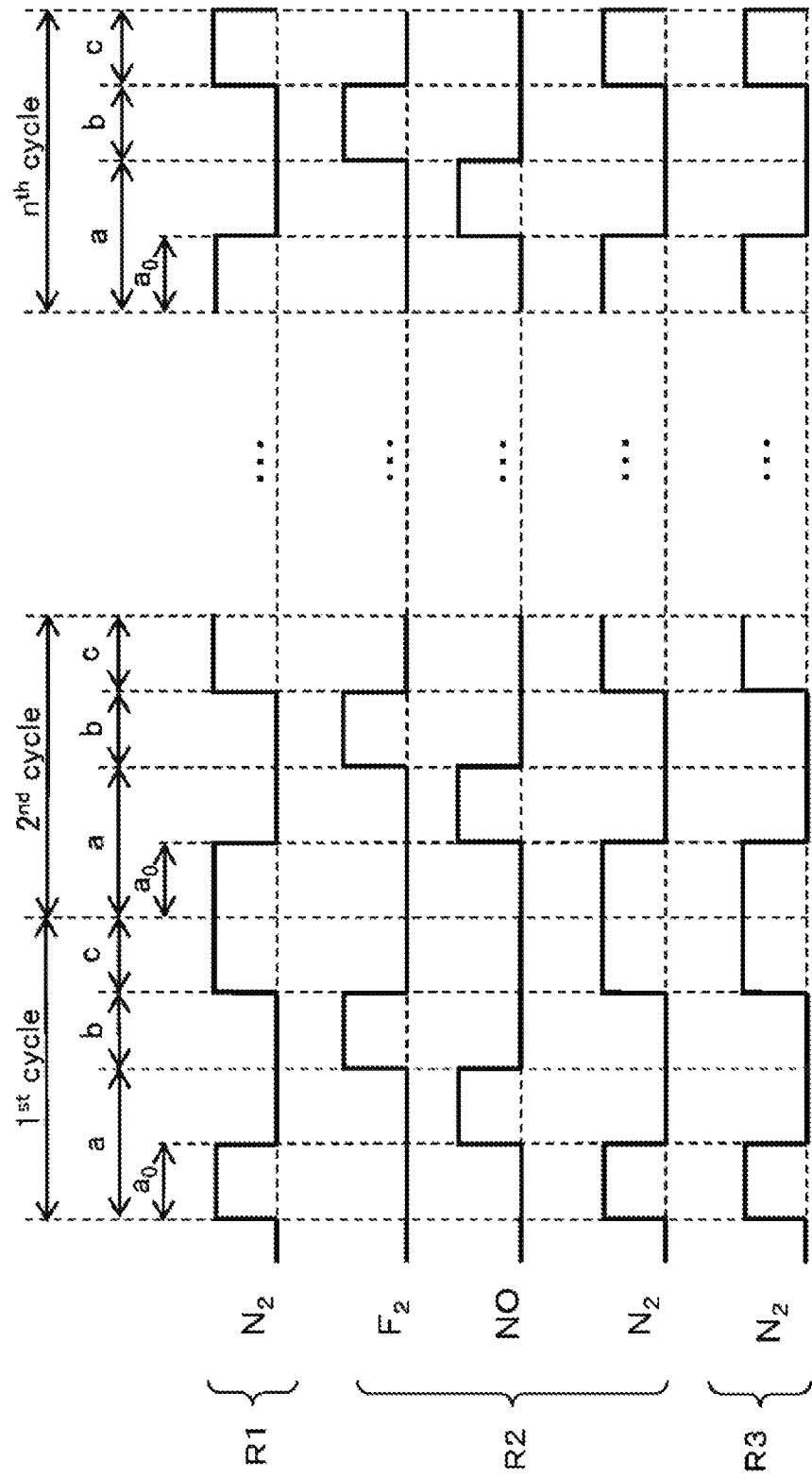

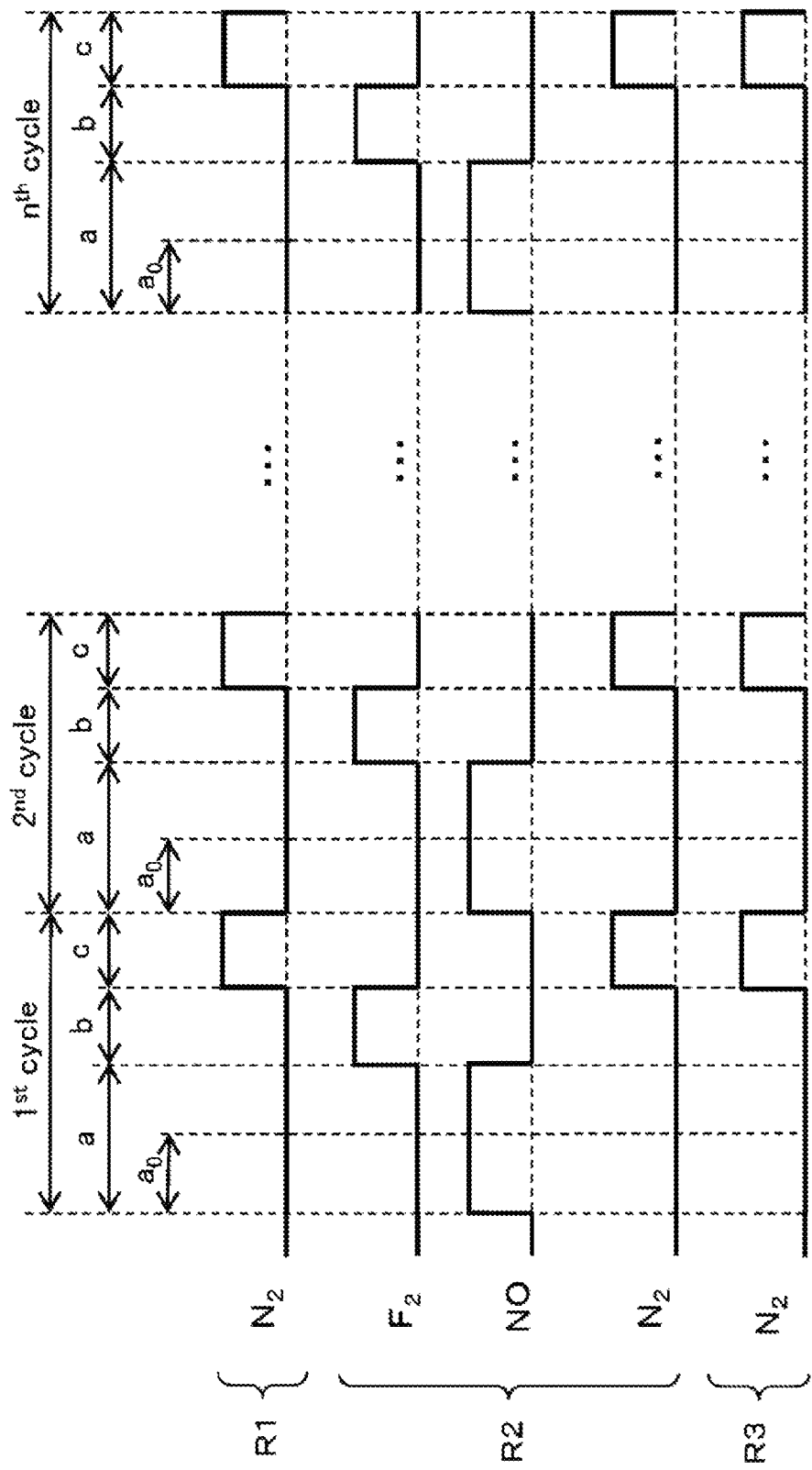

METHOD OF CLEANING, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2018-107168, filed on Jun. 4, 2018, the entire contents of which are incorporated herein by reference.

TECHNICAL FIELD

The present disclosure relates to a method of cleaning, a method of manufacturing a semiconductor device, a substrate-processing apparatus, and a recording medium.

BACKGROUND

As a process of manufacturing a semiconductor device, a process of processing a substrate by supplying a processing gas from a supply part to a substrate in a process container may be performed in some cases. When a predetermined amount of deposits adheres to an interior of the supply part by performing this process, a cleaning process in the supply part may be performed at a predetermined timing in some cases.

SUMMARY

Some embodiments of the present disclosure provide a technique capable of improving the quality of a process of cleaning an interior of a supply part that supplies a processing gas to a substrate.

According to one or more embodiments of the present disclosure, there is provided a technique of cleaning an interior of a supply part by performing a cycle a predetermined number of times, the cycle including: (a) supplying a first gas, which is one of a cleaning gas and an additive gas that reacts with the cleaning gas, from the supply part toward an interior of a process container in which a substrate has been processed by supplying a processing gas from the supply part to the substrate; and (b) supplying a second gas, which is the other one of the cleaning gas and the additive gas and is different from the first gas, from the supply part toward the interior of the process container in a state in which a part of the first gas remains in the supply part after supply of the first gas is stopped.

BRIEF DESCRIPTION OF DRAWINGS

FIG. 4B is a diagram showing a modification example of the gas supply sequence of the first cleaning process according to embodiments of the present disclosure.

FIGS. 5A and 5B are diagrams showing modification examples of the gas supply sequence of the first cleaning process according to embodiments of the present disclosure.

DETAILED DESCRIPTION

Figure 1:
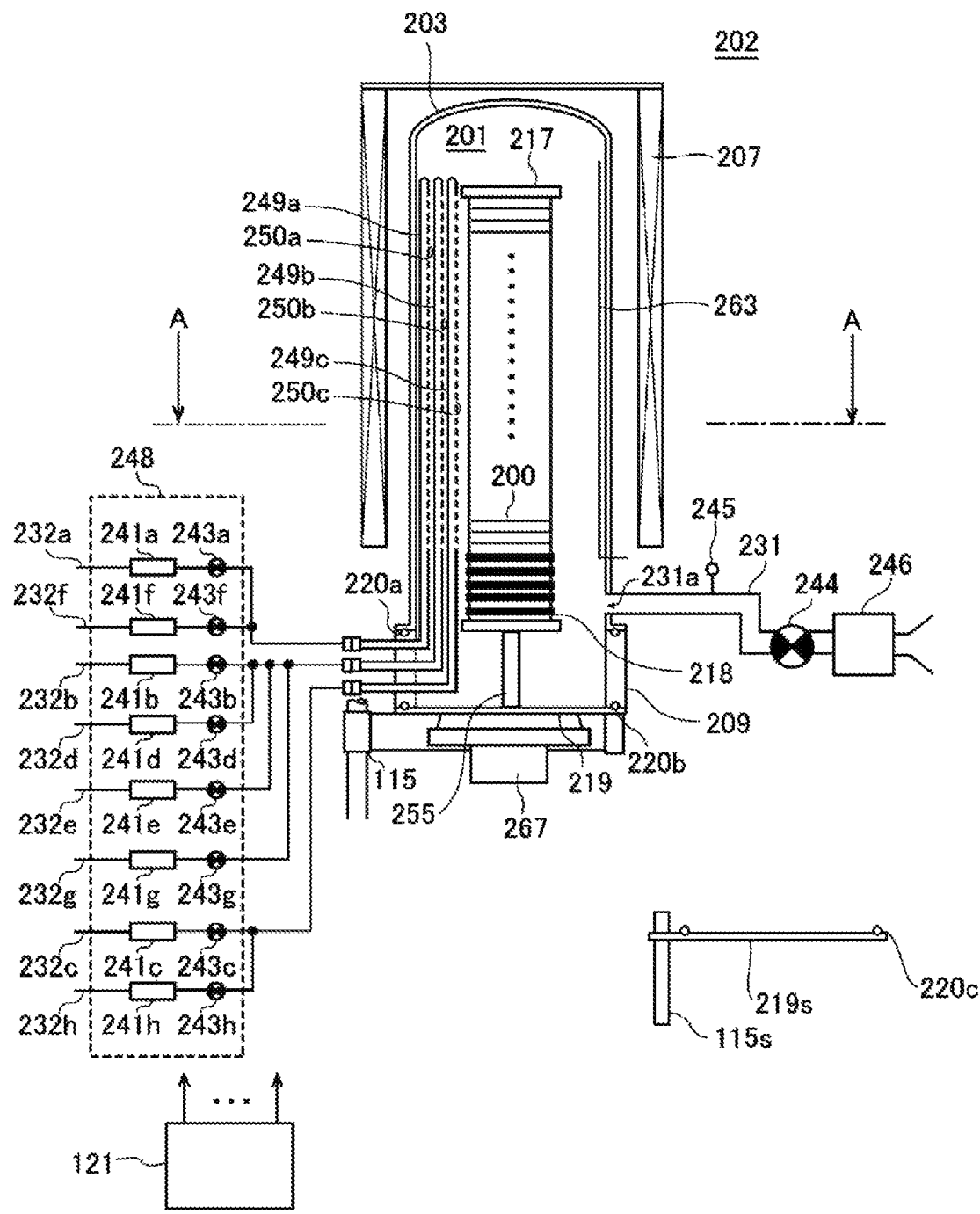
FIG. 1 is a schematic configuration diagram of a vertical process furnace of a substrate-processing apparatus suitably used in embodiments of the present disclosure, in which a part of the process furnace is shown in a vertical sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

One or More Embodiments of the Present Disclosure

One or more embodiments of the present disclosure will now be described with reference to FIGS. 1 to 3 and FIG. 4A.

(1) Configuration of Substrate-Processing Apparatus

As shown in FIG. 1, a process furnace 202 includes a heater 207 as a heating mechanism (temperature adjustment part). The heater 207 has a cylindrical shape and is vertically installed by being supported on a holding plate. The heater 207 also functions as an activation mechanism (excitation part) that thermally activates (excites) a gas.

Inside the heater 207, a reaction tube 203 is arranged concentrically with the heater 207. The reaction tube 203 is made of a heat-resistant material such as, for example, quartz ($SiO_2$) or silicon carbide (SiC) and is formed in a cylindrical shape with its upper end closed and its lower end opened. Under the reaction tube 203, a manifold 209 is disposed concentrically with the reaction tube 203. The manifold 209 is made of a metallic material such as, for example, stainless steel (SUS) or the like and is formed in a cylindrical shape with its upper and lower ends opened. The upper end portion of the manifold 209 is engaged with the lower end portion of the reaction tube 203 and is configured to support the reaction tube 203. An O-ring 220a as a seal member is provided between the manifold 209 and the reaction tube 203. The reaction tube 203 is vertically installed as the heater 207. A processing vessel (reaction vessel) mainly includes the reaction tube 203 and the manifold 209. A process chamber 201 is formed in the hollow portion of the processing vessel. The process chamber 201 is configured to accommodate wafers 200 as substrates. Processing of the wafers 200 is performed in the process chamber 201.

In the process chamber 201, nozzles 249a to 249c as first to third supply parts are respectively provided to penetrate the side wall of the manifold 209. The nozzles 249a to 249c are also referred to as first to third nozzles. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles from one another. The nozzles 249a and 249c are provided adjacent to the nozzle 249b, and are disposed so as to sandwich the nozzle 249b from both sides thereof.

Mass flow controllers (WC) 241a to 241c as flow rate controllers (flow rate control parts) and valves 243a to 243c as opening/closing valves are respectively provided in the gas supply pipes 232a to 232c sequentially from the upstream side of a gas flow. Gas supply pipes 232d and 232e are connected to the gas supply pipe 232b on the downstream side of the valve 243b. MFCs 241d and 241e and valves 243d and 243e are respectively provided in the gas supply pipes 232d and 232e sequentially from the upstream side of a gas flow. Gas supply pipes 232f to 232h are connected to the gas supply pipes 232a to 232c on the downstream side of the valves 243a to 243c, respectively. In the gas supply pipes 232f to 232h, MFCs 241f to 241h and valves 243f to 243h are provided sequentially from the upstream side of a gas flow. The gas supply pipes 232a to 232h are made of, for example, a metallic material such as stainless steel (SUS) or the like.

Figure 2:
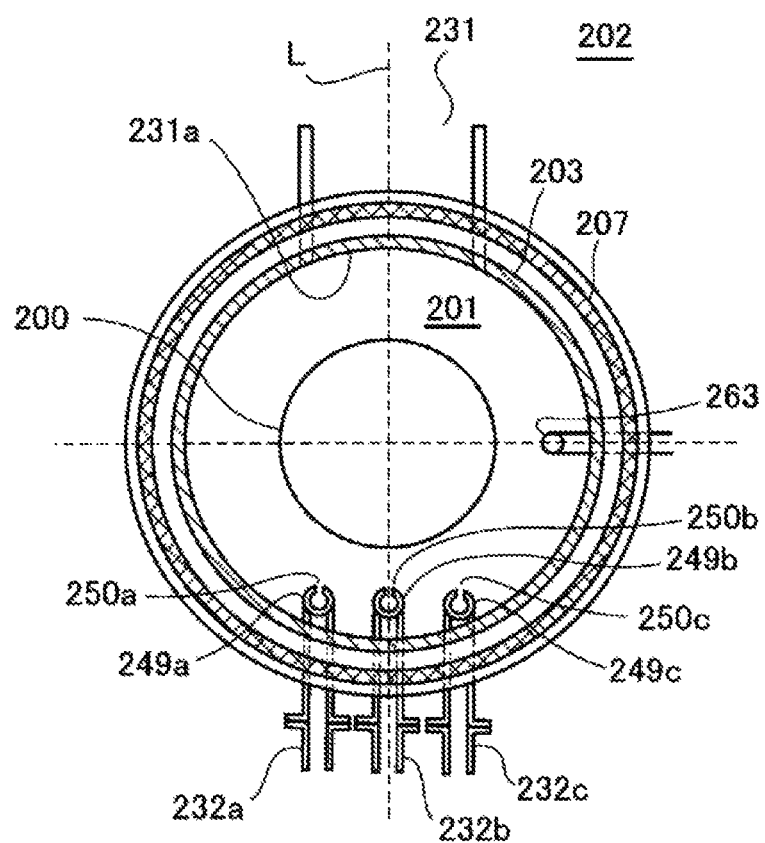
FIG. 2 is a schematic configuration diagram of a part of a vertical process furnace of a substrate-processing apparatus suitably used in embodiments of the present disclosure, in which a part of the process furnace is shown in a sectional view taken along line A-A in FIG. 1.

As shown in FIG. 2, the nozzles 249a to 249c are arranged in an annular space in a plan view between the inner wall of the reaction tube 203 and the wafers 200 and are provided so as to extend upward in the arrangement direction of the wafers 200 from the lower portion of the inner wall of the reaction tube 203 to the upper portion thereof. In other words, the nozzles 249a to 249c are respectively provided in a region existing on the side of a wafer arrangement region, in which the wafers 200 are arranged, and horizontally surrounding the wafer arrangement region, so as to extend along the wafer arrangement region. In a plan view, the nozzle 249b is disposed so as to be opposed to a below-described exhaust port 231a on a straight line across the centers of the wafers 200 loaded into the process chamber 201. The nozzles 249b and 249c are arranged so as to sandwich a straight line L passing through the nozzle 249b and the center of the exhaust port 231a from both sides thereof along the inner wall of the reaction tube 203 (the outer peripheral portions of the wafers 200). The straight line L is also a straight line passing through the nozzle 249b and the centers of the wafers 200. It can also be said that the nozzle 249c is provided on the opposite side to the nozzle 249a across the straight line L. The nozzles 249a and 249c are disposed in line symmetry with the straight line L as an axis of symmetry. Gas supply holes 250a to 250c for supplying gases are provided on the side surfaces of the nozzles 249a to 249c, respectively. The respective gas supply holes 250a to 250c are opened so as to be opposed to (face) the exhaust port 231a in a plan view and can supply gases toward the wafers 200. The gas supply holes 250a to 250c are provided in a plural number from the lower portion to the upper portion of the reaction tube 203.

As a processing gas, i.e., a reactant having a chemical structure (molecular structure) different from that of a precursor described below, for example, a hydrogen nitride-based gas which is a nitrogen (N)-containing gas, is supplied from the gas supply pipes 232a and 232c into the process chamber 201 via the MFCs 241a and 241c, the valves 243a and 243c, and the nozzles 249a and 249c. The hydrogen nitride-based gas acts as a nitriding gas, i.e., an N source. For example, an ammonia ($NH_3$) gas may be used as the hydrogen nitride-based gas.

As a processing gas, i.e., a precursor (precursor gas), for example, a halosilane-based gas containing Si, which is a predetermined element (main element) constituting a film, and a halogen element is supplied from the gas supply pipe 232b into the process chamber 201 via the MFC 241b, the valve 243b, and the nozzle 249b. The precursor gas refers to a precursor in a gaseous state, for example, a gas obtained by vaporizing a precursor staying in a liquid state under a room temperature and an atmospheric pressure, a precursor staying in a gaseous state under a room temperature and an atmospheric pressure, or the like. Halosilane refers to a silane having halogen groups. The halogen groups may include a chloro group, a fluoro group, a bromo group, an iodo group, and the like. That is to say, the halogen groups may include halogen elements such as chlorine (Cl), fluorine (F), bromine (Br), iodine (I), and the like. As the halosilane-based gas, for example, a precursor gas containing Si and Cl, that is a chlorosilane-based gas may be used. The chlorosilane-based gas acts as a Si source. As the chlorosilane-based gas, for example, a hexachlorodisilane ($Si_2Cl_6$, abbreviation: HCDS) gas may be used. The HCDS gas is a gas containing an element (Si) which independently becomes solid under a processing condition described below, i.e., a gas capable of independently depositing a film under a processing condition described below.

As a cleaning gas, a fluorine-based gas is supplied from the gas supply pipe 232d into the process chamber 201 via the MFC 241d, the valve 243d, the gas supply pipe 232b, and the nozzle 249b. For example, a fluorine ($F_2$) gas may be used as the fluorine-based gas.

As an additive gas having a chemical structure (molecular structure) different from that of the cleaning gas described above, a nitrogen oxide-based gas is supplied from the gas supply pipe 232e into the process chamber 201 via the MFC 241e, the valve 243e, the gas supply pipe 232b, and the nozzle 249b. The nitrogen oxide-based gas alone does not perform a cleaning action. By reacting with a fluorine-based gas, the nitrogen oxide-based gas generates active species such as, for example, fluorine radicals, a nitrosyl fluoride compound and the like, and acts to improve the cleaning action of the fluorine-based gas. For example, a nitrogen monoxide (NO) gas may be used as the nitrogen oxide-based gas.

As an inert gas, for example, a nitrogen ($N_2$) gas is supplied from the gas supply pipes 232f to 232h into the process chamber 201 via the MFCs 241f to 241h, the valves 243f to 243h, the gas supply pipes 232a to 232c, and the nozzles 249a to 249c. The $N_2$ gas acts as a purge gas, a carrier gas, a dilution gas or the like.

A second processing gas supply system (reactant supply system) mainly includes the gas supply pipe 232a, the MFC 241a, and the valve 243a, and/or includes the gas supply pipe 232c, the MFC 241c, and the valve 243c. A first processing gas supply system (precursor supply system) mainly includes the gas supply pipe 232b, the MFC 241b, and the valve 243b. A cleaning gas supply system mainly includes the gas supply pipe 232d, the MFC 241d, and the valve 243d. An additive gas supply system mainly includes the gas supply pipe 232e, the MFC 241e, and the valve 243e.

An inert gas supply system mainly includes the gas supply pipes 232f to 232h, the MFCs 241f to 241h, and the valves 243f to 243h.

One or all of the above-mentioned various supply systems may be configured as an integrated supply system 248 formed by integrating the valves 243a to 243h, the MFCs 241a to 241h, and the like. The integrated supply system 248 are connected to each of the gas supply pipes 232a to 232h and are configured so that the supply operations of the various gases to the gas supply pipes 232a to 232h, i.e., the opening/closing operation of the valves 243a to 243h, the flow-rate-adjusting operation of the MFCs 241a to 241h, and the like can be controlled by a controller 121 which will be described below. The integrated supply system 248 is formed of a single body or split-type integrated units. The integrated supply system 248 may be attached to and detached from the gas supply pipes 232a to 232h or the like on an integrated unit basis. The maintenance, replacement, expansion or the like of the integrated supply system 248 may be performed on an integrated unit basis.

An exhaust port 231a for exhausting the atmosphere inside the process chamber 201 is provided under the sidewall of the reaction tube 203. As shown in FIG. 2, the exhaust port 231a is provided at a position opposed to (facing) the nozzles 249a to 249c (gas supply holes 250a to 250c) across the wafers 200 in a plan view. The exhaust port 231a may be provided along the upper portion of the sidewall of the reaction tube 203 from the lower portion thereof, i.e., along the wafer arrangement region. An exhaust pipe 231 is connected to the exhaust port 231a. A vacuum pump 246 as a vacuum-exhaust device is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured so that the vacuum-exhaust of the interior of the process chamber 201 and the stop of the vacuum-exhaust can be performed by opening and closing the APC valve 244 in a state in which the vacuum pump 246 is operated, and so that the pressure inside the process chamber 201 can be regulated by adjusting a degree of valve opening based on the pressure information detected by the pressure sensor 245 in a state in which the vacuum pump 246 is operated. An exhaust system mainly includes the exhaust pipe 231, the APC valve 244, and the pressure sensor 245. The vacuum pump 246 may be included in the exhaust system.

The exhaust pipe 231 is made of an alloy excellent in heat resistance and corrosion resistance. As the alloy, in addition to stainless steel, it may be possible to suitably use, for example, Hastelloy (registered trademark) whose heat resistance and corrosion resistance are enhanced by adding iron (Fe), molybdenum (Mo), chromium (Cr) or the like to nickel (Ni), Inconel (registered trademark) whose heat resistance and corrosion resistance are enhanced by adding Fe, Cr, niobium (Nb), Mo or the like to Ni, and so forth.

A seal cap 219 as a furnace-opening port lid capable of airtightly closing the lower end opening of the manifold 209 is provided below the manifold 209. The seal cap 219 is made of a metallic material such as, for example, stainless steel or the like and is formed in a disc shape. On the upper surface of the seal cap 219, there is provided an O-ring 220b as a seal member which makes contact with the lower end of the manifold 209. Below the seal cap 219, there is installed a rotation mechanism 267 for rotating a boat 217 to be described below. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be raised or lowered in the vertical direction by a boat elevator 115 as an elevating mechanism installed outside the reaction tube 203. The boat elevator 115 is configured as a transfer device (transfer mechanism) that loads and unloads (transfers) the wafers 200 into and out of the process chamber 201 by raising and lowering the seal cap 219. Under the manifold 209, there is provided a shutter 219s as a furnace-opening port capable of airtightly closing the lower end opening of the manifold 209 in a state in which the seal cap 219 is lowered to unload the boat 217 from the interior of the process chamber 201. The shutter 219s is made of a metallic material such as, for example, stainless steel or the like, and is formed in a disk shape. On the upper surface of the shutter 219s, there is provided an O-ring 220c as a seal member which makes contact with the lower end of the manifold 209. The opening and closing operations (the elevating operation, the rotating operation, and the like) of the shutter 219s are controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. The boat 217 is made of a heat resistant material such as, for example, quartz or SiC. Heat-insulating plates 218 made of a heat resistant material such as, for example, quartz or SiC are disposed in multiple stages at the lower portion of the boat 217.

In the reaction tube 203, there is installed a temperature sensor 263 as a temperature detector. By adjusting the state of supplying electric power to the heater 207 based on the temperature information detected by the temperature sensor 263, the temperature inside the process chamber 201 is controlled to have a desired temperature distribution. The temperature sensor 263 is provided along the inner wall of the reaction tube 203.

Figure 3:
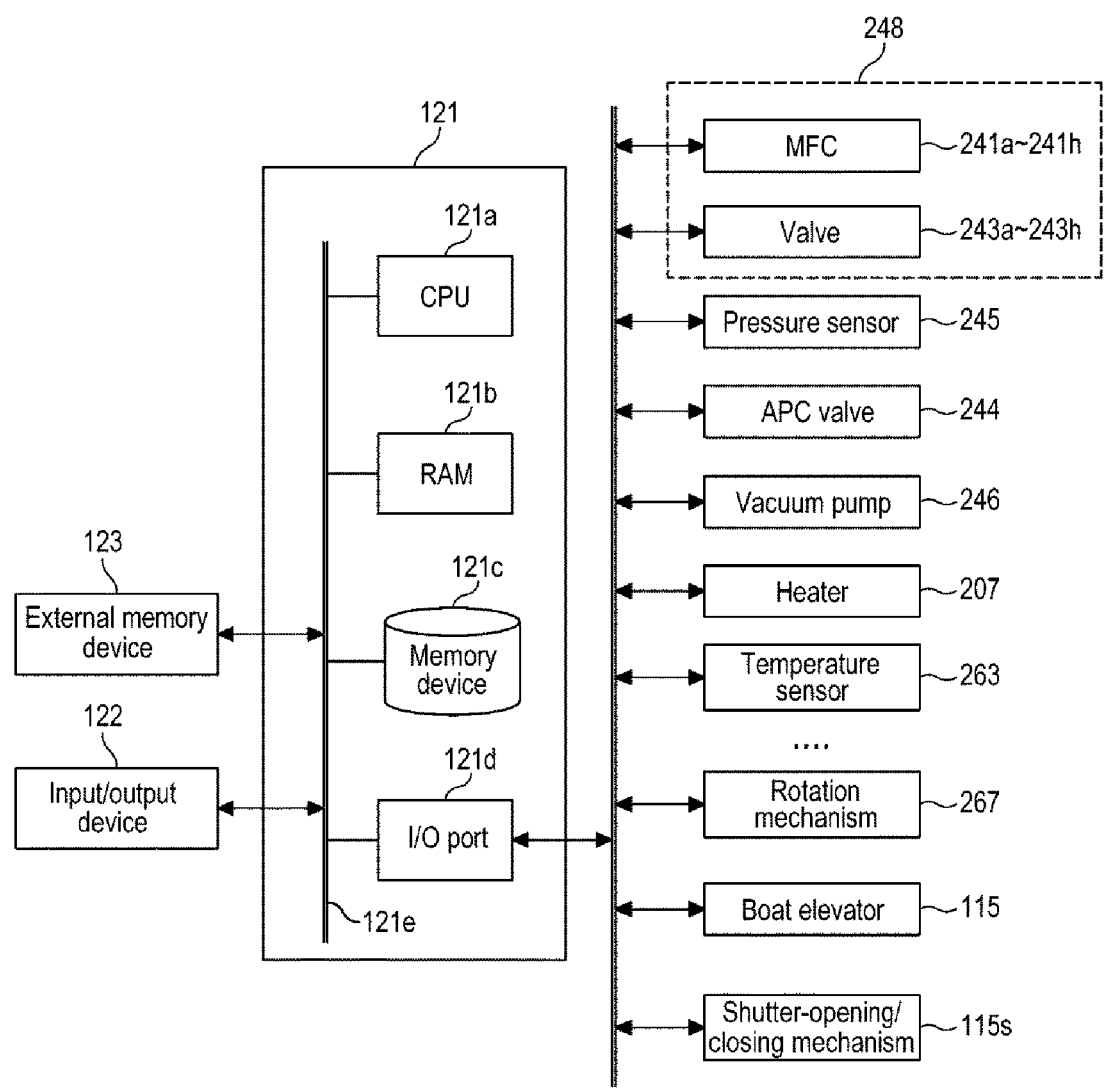
FIG. 3 is a schematic configuration diagram of a controller of a substrate-processing apparatus suitably used in embodiments of the present disclosure, in which a control system of a controller is shown in a block diagram.

As shown in FIG. 3, the controller 121 as a control part (control means) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate-processing apparatus, a process recipe in which sequences and conditions of a substrate-processing process to be described below are written, a cleaning recipe in which sequences and conditions of a cleaning process to be described below are written, and the like are readably stored in the memory device 121c. The process recipe functions as a program for causing the controller 121 to execute each sequence in the substrate-processing process, which will be described below, to obtain a predetermined result. The cleaning recipe functions as a program for causing the controller 121 to execute each sequence in the cleaning process, which will be described below, to obtain a predetermined result. Hereinafter, the process recipe, the cleaning recipe, and the control program will be generally and simply referred to as a "program." Furthermore, the process recipe or the cleaning recipe will also be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter-opening/closing mechanism 115s, and the like.

The CPU 121a is configured to read the control program from the memory device 121c and execute the same. The CPU 121a is also configured to read the recipe from the memory device 121c according to an input of an operation command from the input/output device 122. The CPU 121a is configured to control, according to the contents of the recipe thus read, the flow-rate-adjusting operation of various kinds of gases by the MFCs 241a to 241h, the opening/closing operation of the valves 243a to 243h, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the opening/closing operation of the shutter 219s by the shutter-opening/closing mechanism 115s, and the like.

The controller 121 may be configured by installing, in a computer, the aforementioned program stored in an external memory device 123. The external memory device 123 includes, for example, a magnetic disk such as a HDD or the like, an optical disk such as a CD or the like, a magneto-optical disk such as an MO or the like, and a semiconductor memory such as a USB memory, or the like. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate-Processing Process

An example of a substrate-processing sequence, i.e., an example of a film-forming sequence, of forming a film over a wafer 200 as a substrate using the aforementioned substrate-processing apparatus, which is a process for manufacturing a semiconductor device, will be described below. In the following descriptions, the operations of the respective parts that constitute the substrate-processing apparatus are controlled by the controller 121.

In the film-forming sequence of the present embodiments, as the film, a silicon nitride film (SiN film), which is a film containing Si and N, is formed over a wafer 200 by performing a cycle a predetermined number of times, the cycle including non-simultaneously performing: step 1 of supplying a HCDS gas as a precursor to the wafer 200 in a process container; and step 2 of supplying an NH₃ gas as a reactant to the wafer 200 in the process container In the present disclosure, the film-forming sequence described above may be denoted as follows for the sake of convenience. The same notation will also be used in the following descriptions of modification examples and the like.

(HCDS→NH₃)×n⇒SiN

When the term "wafer" is used herein, it may refer to "a wafer itself" or "a laminated body of a wafer and a predetermined layer or film formed over the surface of the wafer." Furthermore, when the phrase "a surface of a wafer" is used herein, it may refer to "a surface of a wafer itself" or "a surface of a predetermined layer or the like formed over a wafer." Moreover, the expression "a predetermined layer is formed over a wafer" as used herein may mean that "a predetermined layer is directly formed over a surface of a wafer itself" or that "a predetermined layer is formed over a layer or the like formed over a wafer." In addition, when the term "substrate" is used herein, it may be synonymous with the term "wafer."

(Wafer Charging and Boat Loading)

When a plurality of wafers 200 is charged on the boat 217 (wafer charging), the shutter 219s is moved by the shutter-opening/closing mechanism 115s to open the lower end opening of the manifold 209 (shutter opening). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

(Pressure Regulation and Temperature Adjustment)

The interior of the process chamber 201, that is, the space in which the wafers 200 exist, is vacuum-exhausted (depressurization-exhausted) by the vacuum pump 246 so as to reach a desired pressure (degree of vacuum). At this time, the pressure in the process chamber 201 is measured by the pressure sensor 245. The APC valve 244 is feedback-controlled based on the measured pressure information. The wafers 200 in the process chamber 201 are heated by the heater 207 to a desired temperature. At this time, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201 and the heating and rotation of the wafers 200 may be continuously performed at least until the processing of the wafers 200 is completed.

(Film-Forming Step)

Thereafter, the following steps 1 and 2 are sequentially executed.

[Step 1]

In this step, a HCDS gas is supplied to the wafer 200 in the process chamber 201 (HCDS gas supply step). Specifically, the valve 243b is opened to allow the HCDS gas to flow into the gas supply pipe 232b. The flow rate of the HCDS gas is adjusted by the MFC 241b. The HCDS gas is supplied into the process chamber 201 through the nozzle 249b and is exhausted from the exhaust port 231a. In this case, the HCDS gas is supplied to the wafer 200. At this time, the valves 243f and 243h are opened to supply an N₂ gas into the process chamber 201 through the nozzles 249a and 249c. At this time, the valve 243g may be opened to supply the $N_2$ gas into the process chamber 201 through the nozzle 249b.

An example of a processing condition in this step may be described as follows.

HCDS gas supply flow rate: 0.01 to 2 slm, preferably 0.1 to 1 slm $N_2$ gas supply flow rate (for each gas supply pipe): 0 to 10 slm Supply time for each gas: 1 to 120 seconds, preferably 1 to 60 seconds Processing temperature: 250 to 800 degrees C., preferably 400 to 700 degrees C.

Processing pressure: 1 to 2666 Pa, preferably 67 to 1333 Pa

Further, the notation of the numerical range such as "250 to 800 degrees C." in the present disclosure means that the lower limit value and the upper limit value are included in the range. Thus, for example, "250 to 800 degrees C." means "250 degrees C. or higher and 800 degrees C. or lower." The same applies to other numerical ranges.

By supplying the HCDS gas to the wafer 200 under the condition described above, a Si-containing layer containing Cl is formed as a first layer over the outermost surface of the wafer 200. The Si-containing layer containing Cl is formed as HCDS is physically adsorbed on the outermost surface of the wafer 200, as a substance (hereinafter referred to as $Si_xCl_y$) generated by partial decomposition of HCDS is chemically adsorbed on the outermost surface of the wafer 200, or as Si is deposited on the outermost surface of the wafer 200 by the pyrolysis of HCDS. The Si-containing layer containing Cl may be an adsorption layer (physical adsorption layer or chemical adsorption layer) of HCDS or $Si_xCl_y$, or may be a Si layer (Si deposition layer) containing Cl. In the present disclosure, the Si-containing layer containing Cl is also simply referred to as a Si-containing layer.

After the first layer is formed, the valve 243b is closed to stop the supply of the HCDS gas into the process chamber 201. Then, the interior of the process chamber 201 is vacuum-exhausted to remove the gas and the like remaining in the process chamber 201 from the interior of the process chamber 201 (purge step). At this time, the valves 243f to 243h are opened to supply the $N_2$ gas into the process chamber 201. The $N_2$ gas acts as a purge gas.

As the precursor, in addition to the HCDS gas, it may be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, or the like. Similar to the HCDS gas, these gases are gases that can independently deposit a film under the processing condition described above.

As the inert gas, in addition to the $N_2$ gas, it may be possible to use a rare gas such as an Ar gas, a He gas, a Ne gas, a Xe gas, or the like. This applies to step 2 and the cleaning process described below.

[Step 2]

After step 1 is completed, an $NH_3$ gas is supplied to the wafer 200 in the process chamber 201, i.e., the first layer formed over the wafer 200 ($NH_3$ gas supply step). Specifically, the valve 243a is opened to allow the $NH_3$ gas to flow into the gas supply pipe 232a. The flow rate of the $NH_3$ gas is adjusted by the MFC 241a. The $NH_3$ gas is supplied into the process chamber 201 through the nozzle 249a and is exhausted from the exhaust port 231a. In this case, the $NH_3$ gas is supplied to the wafer 200. At this time, the valves 243g and 243h are opened to supply the $N_2$ gas into the process chamber 201 through the nozzles 249b and 249c. At this time, the valve 243f may be opened to supply the $N_2$ gas into the process chamber 201 through the nozzle 249a.

An example of a processing condition in this step may be described as follows.

$NH_3$ gas supply flow rate: 0.1 to 10 slm $N_2$ gas supply flow rate (for each gas supply pipe): 0 to 2 slm $NH_3$ gas supply time: 1 to 120 seconds, preferably 1 to 60 seconds Processing pressure: 1 to 4000 Pa, preferably 1 to 3000 Pa Other processing conditions are the same as the processing conditions of step 1.

By supplying the $NH_3$ gas to the wafer 200 under the above-described condition, at least a part of the first layer formed over the wafer 200 is nitrided (modified). By modifying the first layer, a second layer containing Si and N, that is a SiN layer is formed over the wafer 200. When forming the second layer, impurities such as Cl and the like contained in the first layer constitute a gaseous substance containing at least Cl in the course of the modifying reaction of the first layer performed using the $NH_3$ gas. The gaseous substance is discharged from the interior of the process chamber 201. As a result, the second layer becomes a layer having a smaller amount of impurities such as Cl and the like than the first layer.

After the second layer is formed, the valve 243a is closed to stop the supply of the $NH_3$ gas into the process chamber 201. Then, by the same processing procedure as the purge step of step 1, the gas and the like remaining in the process chamber 201 are removed from the interior of the process chamber 201 (purge step).

As the reactant, in addition to the $NH_3$ gas, it may be possible to use, for example, a hydrogen nitride-based gas such as a diazene ($N_2H_2$) gas, a hydrazine ($N_2H_4$) gas, an $N_3H_8$ gas, or the like.

[Performing a Predetermined Number of Times]

A SiN film having a predetermined composition and a predetermined film thickness can be formed over the wafer 200 by performing a cycle a predetermined number of times (m times where m is an integer of 1 or larger), the cycle including non-simultaneously, i.e., asynchronously performing steps 1 and 2 described above. The cycle described above is preferably repeated a plurality of times. That is to say, it is preferable that the thickness of the second layer formed when performing the above-described cycle once is set to be smaller than a desired film thickness, and the above-described cycle is repeated a plurality of times until the film thickness of the SiN film formed by stacking the second layer reaches the desired film thickness.

(After-Purge and Atmospheric Pressure Restoration)

After the film-forming step is completed, the $N_2$ gas as a purge gas is supplied from each of the nozzles 249a to 249c into the process chamber 201 and is exhausted from the exhaust port 231a. As a result, the interior of the process chamber 201 is purged, and the gas or reaction byproduct remaining in the process chamber 201 is removed from the interior of the process chamber 201 (after-purge). Thereafter, the atmosphere in the process chamber 201 is replaced by an inert gas (inert gas replacement), and the pressure in the process chamber 201 is restored to the atmospheric pressure (atmospheric pressure restoration).

(Boat Unloading and Wafer Discharging)

The seal cap 219 is lowered by the boat elevator 115 and the lower end of the manifold 209 is opened. Then, the processed wafers 200 are unloaded from the lower end of the manifold 209 to the outside of the reaction tube 203 in a state in which the processed wafers 200 are supported by the boat 217 (boat unloading). After the boat unloading, the shutter 219s is moved so that the lower end opening of the manifold 209 is sealed by the shutter 219s via the O-ring 220c (shutter closing). The processed wafers 200 are taken out to the outside of the reaction tube 203 and then discharged from the boat 217 (wafer discharging).

(3) Cleaning Process

When the above-described substrate-processing process is performed, deposits including a thin film such as a SiN film or the like may be deposited and accumulated inside the nozzle 249b for supplying the HCDS gas. This is because, in step 2 described above, even if the $N_2$ gas is supplied from the nozzle 249b which does not supply the $NH_3$ gas and even if efforts are made to prevent the $NH_3$ gas from intruding into the nozzle 249b, a predetermined amount of $NH_3$ gas may intrude into the nozzle 249b. In such a case, the remaining HCDS gas and the intruding $NH_3$ gas are mixed inside the nozzle 249b heated to the film-forming temperature, and the reaction corresponding to the above-described film-forming reaction proceeds, whereby deposits including a thin film such as a SiN film or the like may be accumulated in some cases.

Furthermore, in step 1 described above, even if the $N_2$ gas is supplied from each of the nozzles 249a and 249c which do not supply the HCDS gas and even if efforts are made to prevent the HCDS gas from intruding into the nozzles 249a and 249c, a predetermined amount of HCDS gas may intrude into the nozzles 249a and 249c. Moreover, in step 2 described above, even if the $N_2$ gas is supplied from the nozzle 249c which does not supply the $NH_3$ gas and even if efforts are made to prevent the $NH_3$ gas from intruding into the nozzle 249c, a predetermined amount of $NH_3$ gas may intrude into the nozzle 249c. As a result, deposits including a thin film such as a SiN film or the like may be accumulated not only inside the nozzle 249b but also inside the nozzles 249a and 249c.

Furthermore, when the above-described substrate-processing process is performed, deposits including a thin film such as a SiN film or the like may be accumulated not only inside the nozzles 249a to 249c but also inside the process container, for example, on the inner wall of the reaction tube 203, the surfaces of the nozzles 249a to 249c, the surface of the boat 217, and the like.

As compared to the inside of the nozzles 249a and 249c, deposits are more likely to be accumulated and Si-rich deposits tend to be accumulated inside the nozzle 249b that supplies the HCDS gas containing Si which is an element that independently becomes solid.

In the present embodiments, the interior of the nozzle 249b and the interior of the process container are cleaned when the amount of deposits accumulated in at least the nozzle 249b or the amount of deposits accumulated in the process container, i.e., the accumulated film thickness, reaches a predetermined amount (thickness) before the deposits are peeled or dropped. In the present disclosure, the process performed inside the nozzle 249b is referred to as a first cleaning process.

In the first cleaning process of the present embodiments, a cycle is performed a predetermined number of times (n times where n is an integer of 1 or more), the cycle including: step (a) of supplying one gas of a cleaning gas and an additive gas that reacts with the cleaning gas from the nozzle 249b as a supply part toward the interior of the process container in which the wafer 200 has been processed by supplying the HCDS gas as a processing gas from the nozzle 249b to the wafer 200; and step (b) of supplying the other gas of the cleaning gas and the additive gas different from the one gas from the nozzle 249b toward the interior of the process container in a state in which the one gas remains in the nozzle 249b after the supply of the one gas is stopped.

In the first cleaning process of the present embodiments, there is no timing at which the cleaning gas and the additive gas are simultaneously supplied into the nozzle 249b. That is to say, when one gas of the cleaning gas and the additive gas is supplied into the nozzle 249b in step (a), the flow rate of the other gas supplied into the nozzle 249b in step (a) is set to zero. Furthermore, when the other gas described above is supplied into the nozzle 249b in step (b), the flow rate of the one gas supplied into the nozzle 249b is set to zero in step (b).

Figure 4A:
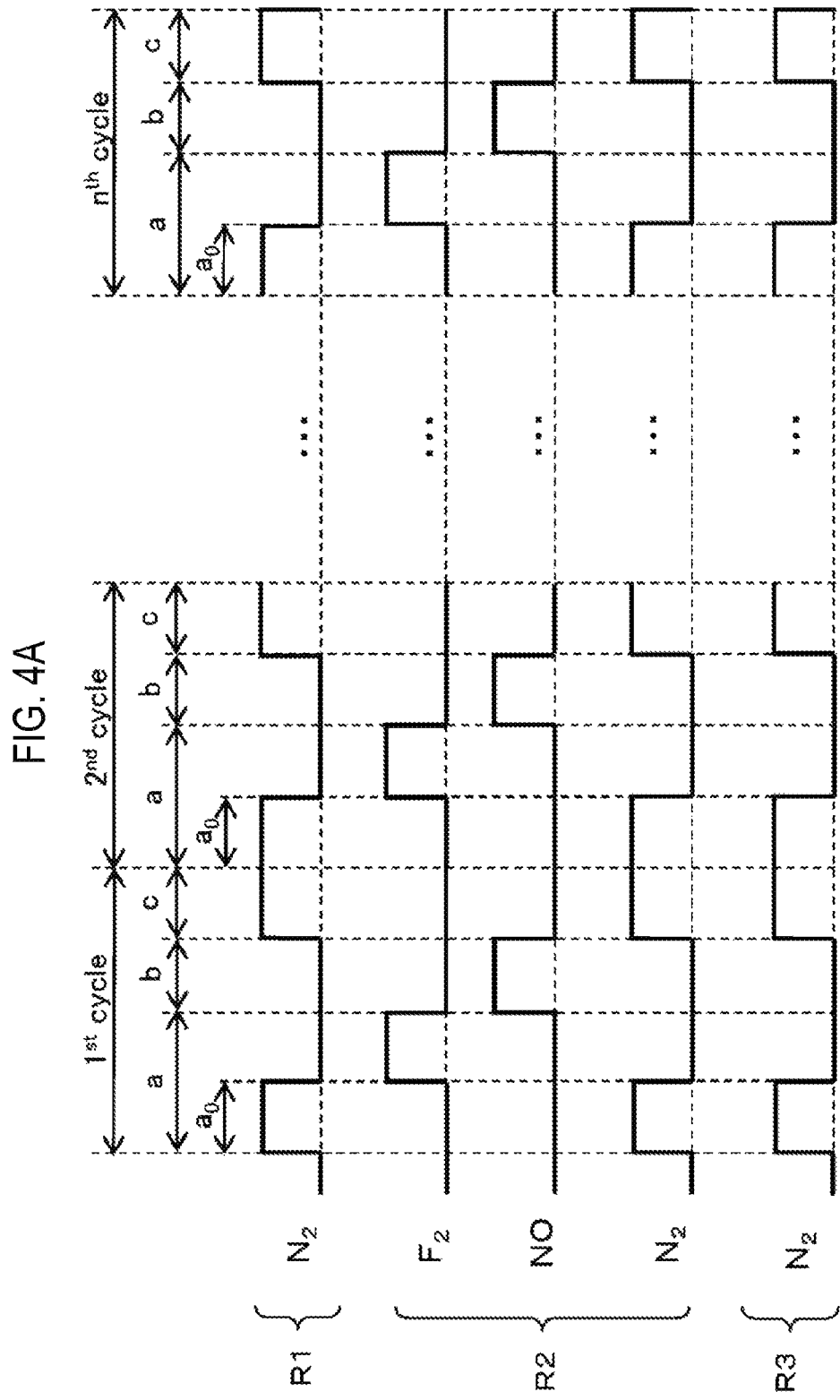
FIG. 4A is a diagram showing a gas supply sequence of a first cleaning process according to embodiments of the present disclosure.

Hereinafter, an example of the first cleaning process using an $F_2$ gas as the cleaning gas and an NO gas as the additive gas will be described with reference to FIG. 4A. FIG. 4A shows an example in which an $F_2$ gas is used as the one gas supplied in step (a) and an NO gas is used as the other gas supplied in step (b). Furthermore, FIG. 4A shows an example in which, in step (a), a pressure regulation step of regulating the pressure in the process container using the $N_2$ gas is performed before supplying the $F_2$ gas into the process container (Press.set). Moreover, FIG. 4A shows an example in which, when performing the above-described cycle, step (c) of removing the gas remaining in the nozzle 249b, preferably in the nozzles 249a to 249c and in the process container, is performed after stopping the supply of the NO gas, that is, after performing step (b) (PRG).

In FIG. 4A, the implementation periods of steps (a) to (c) are denoted as a to c, respectively, for the sake of convenience. Moreover, the implementation period of the pressure regulation step performed in step (a) is denoted as $a_0$ for the sake of convenience. In addition, the nozzles 249a to 249c are denoted as R1 to R3, respectively for the sake of convenience. The implementation period of each step and the notation of each nozzle are the same in FIGS. 4B, 5A, 5B, 6 and 7 that show the gas supply sequence of modifications as described below.

In the present disclosure, the gas supply sequence of the first cleaning process performed in the nozzle 249b may also be denoted as follows for the sake of convenience. The same notation is used in the following descriptions of modification examples.

$$(N_2\text{-Press.set} \rightarrow F_2 \rightarrow NO \rightarrow PRG) \times n \quad\quad R2:$$

In the following descriptions, the operations of the respective parts constituting the substrate-processing apparatus are controlled by the controller 121.

(Boat Loading)

The shutter 219s is moved by the shutter-opening/closing mechanism 115s to open the lower end opening of the manifold 209 (shutter opening). Thereafter, the empty boat 217, i.e., the boat 217 not loaded with the wafers 200 is lifted up by the boat elevator 115 and loaded into the process chamber 201. In this state, the seal cap 219 seals the lower end of the manifold 209 via the O-ring 220b.

(Pressure Regulation and Temperature Adjustment)

The interior of the process chamber 201 is vacuum-exhausted by the vacuum pump 246 so that the interior of the process chamber 201 has a desired pressure (vacuum degree). Furthermore, the interior of the process chamber 201 is heated by the heater 207 to a desired temperature. At this time, the members in the process chamber 201, i.e., the inner wall of the reaction tube 203, the surfaces and the interiors (inner walls) of the nozzles 249a to 249c, the surface of the boat 217, and the like are also heated to the desired temperature. After the temperature in the process chamber 201 reaches a desired temperature, it is controlled so that the desired temperature is maintained until the first to third cleaning processes described below are completed. Subsequently, the rotation of the boat 217 by the rotation mechanism 267 is started. The rotation of the boat 217 is continuously performed until the first to third cleaning processes described below are completed. The boat 217 may not be rotated.

(First Cleaning Process)

Thereafter, the following steps (a) to (c) are sequentially performed.

[Step (a)]

First, step (a) is performed. In this step, as described below, a pressure regulation step and an $F_2$ gas supply step are sequentially performed.

First, an $N_2$ gas is supplied from the nozzles 249a to 249c toward the interior of the process chamber 201 to regulate the pressure in the process chamber 201 to a predetermined processing pressure (pressure regulation step). Specifically, the valves 243f to 243h are opened to allow the $N_2$ gas to flow into the gas supply pipes 232f to 232h. The flow rate of the $N_2$ gas is adjusted by the MFCs 241f to 241h. The $N_2$ gas is supplied into the process chamber 201 through the gas supply pipes 232a to 232c and the nozzles 249a to 249c, and is exhausted from the exhaust port 231a. At this time, the pressure in the process chamber 201 is regulated to a predetermined processing pressure by adjusting the APC valve 244 based on the pressure information detected by the pressure sensor 245. After the pressure in the process chamber 201 reaches the predetermined processing pressure, the valves 243f to 243h are closed to stop the supply of the $N_2$ gas into the process chamber 201.

Subsequently, an $F_2$ gas is supplied from the nozzle 249b toward the process chamber 201 ($F_2$ gas supply step). That is to say, the gas supplied into the process chamber 201 is switched from the $N_2$ gas to the $F_2$ gas. Specifically, the valve 243d is opened to allow the $F_2$ gas to flow into the gas supply pipe 232d. The flow rate of the $F_2$ gas is adjusted by the MFC 241d. The $F_2$ gas is supplied into the process chamber 201 through the gas supply pipe 232b and the nozzle 249b, and is exhausted from the exhaust port 231a. After a predetermined time has elapsed since the start of the supply of the $F_2$ gas, the valve 243d is closed to stop the supply of the $F_2$ gas into the process chamber 201 through the nozzle 249b. At this time, at least one of the valves 243f to 243h may be opened to supply the $N_2$ gas into the process chamber 201 through at least one selected from the group of the nozzles 249a to 249c.

By sequentially performing these steps, a part of the $F_2$ gas supplied from the gas supply pipe 232d remains in the nozzle 249b. A part of the $F_2$ gas remaining in the nozzle 249b floats in the nozzle 249b and moves from the interior of the nozzle 249b toward the interior of the process chamber 201. Furthermore, another part of the $F_2$ gas remaining in the nozzle 249b adheres (physically adsorbs) to the inner wall of the nozzle 249b. Moreover, a further part of the $F_2$ gas remaining in the nozzle 249b slightly reacts with the quartz constituting the inner wall of the nozzle 249b and adheres (chemically adsorbs) on the inner wall of the nozzle 249b.

An example of a processing condition in the pressure regulation step of step (a) may be described as follows.

$N_2$ gas supply flow rate (for each gas supply pipe): 0.5 to 10 slm $N_2$ gas supply time: 10 to 180 seconds Processing pressure: 133 to 26600 Pa, preferably 6650 to 19950 Pa Processing temperature: 30 to 500 degrees C., preferably 200 to 300 degrees C.

An example of a processing condition in the $F_2$ gas supply step of step (a) may be described as follows.

$F_2$ gas supply flow rate: 0.1 to 4 slm, preferably 0.5 to 2 slm $N_2$ gas supply flow rate (for each gas supply pipe): 0 to 10 slm Supply time for each gas: 10 to 120 seconds, preferably 30 to 60 seconds Other processing conditions are the same as the processing conditions of the pressure regulation step.

[Step (b)]

Subsequently, step (b) is performed. In this step, an NO gas is supplied from the nozzle 249b toward the interior of the process chamber 201 in a state in which a part of the $F_2$ gas remains in the nozzle 249b (NO gas supply step). Specifically, the valve 243e is opened to allow the NO gas to flow into the gas supply pipe 232e. The flow rate of the NO gas is adjusted by the MFC 241e. The NO gas is supplied into the process chamber 201 through the gas supply pipe 232b and the nozzle 249b, and is exhausted from the exhaust port 231a. At this time, at least one selected from the group of the valves 243f to 243h may be opened to supply the $N_2$ gas into the process chamber 201 through at least one selected from the group of the nozzles 249a to 249c.

By performing this step, the $F_2$ gas remaining in the nozzle 249b and the NO gas supplied into the nozzle 249b can be mixed and allowed to react with each other in the nozzle 249b. It is possible for this reaction to generate, for example, active species such as fluorine radicals (F*), nitrosyl fluoride (FNO), or the like (hereinafter generally referred to as FNO or the like) in the nozzle 249b. In the nozzle 249b, a mixed gas obtained by adding the FNO or the like to the $F_2$ gas is present. The mixed gas obtained by adding the FNO or the like to the $F_2$ gas makes contact with the interior of the nozzle 249b. At this time, the deposits adhering to the interior of the nozzle 249b can be removed by a thermochemical reaction (etching reaction). The FNO or the like acts to promote the etching reaction by the $F_2$ gas and acts to increase the etching rate of the deposits, i.e., to assist the etching.

In this step, the NO gas is supplied into the nozzle 249b in a state in which a part of the $F_2$ gas remains in the nozzle 249b with the interior of the process chamber 201 exhausted. Therefore, the aforementioned etching reaction can be allowed to proceed while moving a part of the $F_2$ gas remaining in the nozzle 249b into the process chamber 201. That is to say, in this step, it is possible to allow the aforementioned etching reaction to proceed while an amount (concentration or partial pressure) of the $F_2$ gas remaining in the nozzle 249b is decreased with the lapse of time. In other words, in this step, the aforementioned etching reaction can be allowed to proceed while increasing the volume ratio of the NO gas to the $F_2$ gas (hereinafter also referred to as NO gas/$F_2$ gas volume ratio) in the nozzle 249b with the lapse of time.

In this regard, the activity level of the aforementioned etching reaction occurring in the nozzle 249b is changed with the decrease in the amount (concentration or partial pressure) of the $F_2$ gas remaining in the nozzle 249b, i.e., with the increase in NO gas/$F_2$ gas volume ratio. Specifically, before step (b) is started, the NO gas does not exist in the nozzle 249b. Therefore, the NO gas/$F_2$ gas volume ratio in the nozzle 249b is zero, and the aforementioned etching reaction hardly occurs or does not occur at all. After step (b) is started, if the NO gas/$F_2$ gas volume ratio in the nozzle 249b becomes larger than zero, the aforementioned etching reaction begins to progress, and the reaction gradually becomes active. If the NO gas/$F_2$ gas volume ratio in the nozzle 249b reaches a predetermined value by continuing the supply of the NO gas into the nozzle 249b, the aforementioned etching reaction becomes most active, and the reaction activity level reaches a peak. If the NO gas/$F_2$ gas volume ratio in the nozzle 249b is further increased by further continuing the supply of the NO gas into the nozzle 249b, the aforementioned etching reaction is gradually attenuated (deactivated). Then, the $F_2$ gas remaining in the nozzle 249b is almost or entirely discharged from the nozzle 249b, the entire area in the nozzle 249b is filled with the NO gas, and the NO gas/$F_2$ gas volume ratio in the nozzle 249b is infinite. As a result, the etching reaction in the nozzle 249b hardly occurs or does not occur at all.

If the aforementioned etching reaction is allowed to proceed while the amount (concentration or partial pressure) of the $F_2$ gas remaining in the nozzle 249b is decreased with the lapse of time as the present embodiments, the reaction between the $F_2$ gas and the NO gas in the nozzle 249b tends to proceed softer than in the case of maintaining the amount of the $F_2$ gas remaining in the nozzle 249b constant. This is because, if the aforementioned etching reaction is allowed to proceed while the amount (concentration or partial pressure) of the $F_2$ gas remaining in the nozzle 249b is decreased with the lapse of time, the period in which the reaction between the $F_2$ gas and the NO gas in the nozzle 249b becomes most is limited to a part of the entire implementation period of step (b) during which the NO gas/$F_2$ gas volume ratio in the nozzle 249b reaches a predetermined value. Therefore, the etching reaction in the nozzle 249b in the present embodiments proceeds softer than when simultaneously supplying the $F_2$ gas and the NO gas into the nozzle 249b so that the NO gas/$F_2$ gas volume ratio in the nozzle 249b is maintained at the predetermined value. That is to say, if the NO gas/$F_2$ gas volume ratio in the nozzle 249b is increased from zero to infinity with the lapse of time as the present embodiments, the etching reaction is prevented from excessively proceeding in the nozzle 249b. This makes it possible to avoid over-etching of the inner wall of the nozzle 249b.

Furthermore, if the aforementioned etching reaction is allowed to proceed while moving a part of the $F_2$ gas remaining in the nozzle 249b toward the interior of the process chamber 201 as the present embodiments, the peak point of the reaction between the $F_2$ gas and the NO gas in the nozzle 249b, i.e., the point where the reaction between the $F_2$ gas and the NO gas is most active and the etching amount of the deposits is largest, is moved from the upstream side of the gas flow in the nozzle 249b (the lower side in FIG. 1, i.e., a base side of the nozzle 249b) toward the downstream side (the upper side in FIG. 1, i.e., an end side of the nozzle 249b). Thus, in the present embodiments, the aforementioned etching reaction can be caused to proceed while moving the peak point at which the aforementioned etching reaction in the nozzle 249b is most active, i.e., the point where the etching rate of the deposits is largest, from the base side to the end side of the nozzle 249b with the lapse of time after step (b) is started. As a result, in the present embodiments, the aforementioned etching reaction is not caused to intensively proceed only in a specific narrow region in the nozzle 249b, but can be caused to evenly proceed in a wide region in the nozzle 249b, preferably throughout the entire region from the base side to the end side of the nozzle 249b.

In addition, the above-described etching process generates reaction heat by the reaction between the $F_2$ gas and the NO gas. If the aforementioned etching reaction is allowed to proceed while moving a part of the $F_2$ gas remaining in the nozzle 249b toward the process chamber 201 as the present embodiments, the point where the generation amount of the reaction heat generated by the reaction between the $F_2$ gas and the NO gas in the nozzle 249b is largest, i.e., the peak point of the heat generation amount, can be moved from the base side to the end side of the nozzle 249b with the lapse of time after step (b) is started. As a result, in the present embodiments, it is possible to avoid a local temperature increase of a part of the nozzle 249b.

After a predetermined time has elapsed since the supply of the NO gas is started, the valve 243e is closed to stop the supply of the NO gas into the process chamber 201 via the nozzle 249b. In the nozzle 249b, a part of the NO gas supplied from the gas supply pipe 232e remains. A part of the NO gas remaining in the nozzle 249b floats in the nozzle 249b and moves from the interior of the nozzle 249b toward the interior of the process chamber 201. Furthermore, another part of the NO gas remaining in the nozzle 249b adheres (physically adsorbs) to the inner wall of the nozzle 249b.

An example of a processing condition in step (b), i.e., the NO gas supply step may be described as follows.

NO gas supply flow rate: 0.05 to 2 slm, preferably 0.1 to 1 slm

NO gas supply time: 10 to 120 seconds, preferably 30 to 60 seconds

Other processing conditions are the same as the processing conditions of step (a).

[Step (c)]

Subsequently, step (c) is performed. In this step, after the supply of the NO gas into the nozzle 249b is stopped, the gas remaining in the nozzle 249b, preferably in the nozzles 249a to 249c and in the process chamber 201 is removed (residual gas removal step). Specifically, while keeping the APC valve 244 open, the valves 243f to 243h are opened to allow the $N_2$ gas to flow into the gas supply pipes 232f to 232h. The flow rate of the $N_2$ gas is adjusted by the MFCs 241f to 241h. The $N_2$ gas is supplied into the process chamber 201 through the gas supply pipes 232a to 232c and the nozzles 249a to 249c, and is exhausted from the exhaust port 231a.

An example of a processing condition in step (c), i.e., the residual gas removal step may be described as follows.

$N_2$ gas supply flow rate (for each gas supply pipe): 0.5 to 20 slm, preferably 1 to 10 slm $N_2$ gas supply time: 10 to 180 seconds, preferably 10 to 120 seconds Other processing conditions are the same as the processing conditions of step (a).

By performing this step, the interior of the nozzle 249b can be purged, and the NO gas or the like remaining in the nozzle 249b can be removed from the interior of the nozzle 249b. Furthermore, the atmosphere in the nozzle 249b can be replaced with the $N_2$ gas. As a result, when the $F_2$ gas is supplied from the nozzle 249b toward the interior of the process chamber 201 in step (a) of the next cycle, it is possible to prevent the aforementioned etching reaction from unintentionally proceeding in the nozzle 249b.

Furthermore, by properly setting the processing condition in this step, the interiors of the nozzles 249a and 249c and the process chamber 201 can be purged, and the NO gas or the like remaining in the nozzles 249a and 249c and the process chamber 201 can be removed from the interiors of the nozzles 249a and 249c and the process chamber 201, respectively. Moreover, the atmospheres in the nozzles 249a and 249c and the process chamber 201 can be respectively replaced with the $N_2$ gas. As a result, when the $F_2$ gas is supplied from the nozzle 249b toward the interior of the process chamber 201 in step (a) of the next cycle, it is possible to prevent the aforementioned etching reaction from unintentionally proceeding in the nozzles 249a and 249c and the process chamber 201.

Furthermore, by performing this step, it is possible to properly lower the temperature of the nozzle 249b which is increased by the reaction heat of the $F_2$ gas and the NO gas in step (b). As a result, when the $F_2$ gas is supplied from the nozzle 249b toward the interior of the process chamber 201 in step (a) of the next cycle, it is possible to prevent the inner wall of the nozzle 249b from being over-etched by the $F_2$ gas coming into contact with the interior of the nozzle 249b having a high temperature.

[Performing a Predetermined Number of Times]

By performing the cycle including steps (a) to (c) as described above a predetermined number of times (one or more times), it is possible to remove the deposits adhering to the interior of the nozzle 249b.

As the cleaning gas, in addition to the $F_2$ gas, it may be possible to use a hydrogen fluoride (HF) gas, a chlorine fluoride ($ClF_3$) gas, a nitrogen fluoride ($NF_3$) gas, or a mixed gas thereof.

As the additive gas, in addition to the NO gas, it may be possible to use a hydrogen ($H_2$) gas, an oxygen ($O_2$) gas, a nitrous oxide ($N_2O$) gas, an isopropyl alcohol (($CH_3)_2$CHOH, abbreviation: IPA) gas, a methanol ($CH_3OH$) gas, a water vapor ($H_2O$ gas), an HF gas, or a mixed gas thereof.

These points are the same in the second and third cleaning processes which will be described below.

When the HF gas is used as the additive gas, it is preferable to use one of the $F_2$ gas, the $ClF_3$ gas, the $NF_3$ gas, or the mixed gas thereof as the cleaning gas. In addition, when using the HF gas as the cleaning gas and using one of the IPA gas, the methanol gas, the $H_2O$ gas, or the mixed gas thereof as the additive gas, it is preferable that the aforementioned processing temperatures in the first to third cleaning processes is set to a predetermined temperature falling within a range of, for example, 30 to 300 degrees C., preferably 50 to 200 degrees C.

(Second Cleaning Process)

By performing the first cleaning process, a mixed gas obtained by adding the FNO or the like to the $F_2$ gas can also be brought into contact with the interior of the process chamber 201 as well, and at least a part of the deposits adhering to the interior of the process chamber 201 can be removed. However, a part of the deposits adhering to the interior of the process chamber 201 may remain in the process chamber 201 without being removed. Therefore, after the first cleaning process is completed, if necessary, the cleaning process in the process chamber 201 is performed. In the present disclosure, the process performed to the interior of the process chamber 201 will be referred to as a second cleaning process.

Specifically, while the APC valve 244 is closed to stop the exhaust of the interior of the process chamber 201, the $F_2$ gas and the NO gas are simultaneously supplied toward the interior of the process chamber 201 (step (d)). After the pressure in the process chamber 201 rises to a predetermined processing pressure, the supply of the $F_2$ gas and the NO gas toward the inside of the process chamber 201 is stopped while the exhaust of the interior of the process chamber 201 is stopped. The state in which the $F_2$ gas and the NO gas are contained in the process chamber 201 is maintained for a predetermined time (step (e)). After the predetermined containment time has elapsed, the APC valve 244 is opened to exhaust the interior of the process chamber 201, whereby the gas and the like remaining in the process chamber 201 are removed from the interior of the process chamber 201 (step (f)). In the second cleaning process, one cycle including steps (d) to (f) is performed a predetermined number of times (one or more times).

By performing the second cleaning process, the $F_2$ gas and the NO gas can be mixed and reacted in the process chamber 201. As a result, the FNO or the like can be generated in the process chamber 201, and a mixed gas obtained by adding the FNO or the like to the $F_2$ gas can be brought into contact with the interior of the process chamber 201. Thus, an etching reaction can be caused to proceed in the process chamber 201, and the deposits adhering to the interior of the process chamber 201 can be removed. To avoid over-etching of the inner walls of the nozzles 249a to 249c, it is preferable that the same gas supply system as the aforementioned cleaning gas supply system and the same gas supply system as the aforementioned additive gas supply system are connected to the gas supply pipes 232a and 232c, respectively, and that the nozzle used to supply the $F_2$ gas and the nozzle used to supply the NO gas are different nozzles.

An example of a processing condition in the second cleaning process may be described as follows.

$F_2$ gas supply flow rate: 0.5 to 10 slm
NO gas supply flow rate: 0.5 to 10 slm
$N_2$ gas supply flow rate: 0.01 to 20 slm, preferably 0.01 to 10 slm
Supply time for each gas: 10 to 300 seconds, preferably 20 to 120 seconds
Processing pressure: 1330 to 53320 Pa, preferably 9000 to 15000 Pa Other processing conditions are the same as the processing conditions of the first cleaning process.

(Third Cleaning Process)

By performing the first and second cleaning processes, the mixed gas obtained by adding the FNO or the like to the $F_2$ gas can also be brought into contact with the interior of the exhaust pipe 231, and at least a part of the deposits adhering to the interior of the exhaust pipe 231 can be removed. However, a part of the deposits adhering to the interior of the exhaust pipe 231 may remain in the exhaust pipe 231 without being removed. Therefore, after the first and second cleaning processes are completed, if necessary, the cleaning process in the exhaust pipe 231 is performed. In the present disclosure, this process performed to the interior of the exhaust pipe 231 will be referred to as a third cleaning process.

Specifically, while the APC valve 244 is opened to exhaust the interior of the process chamber 201, the $F_2$ gas and the NO gas are simultaneously supplied toward the interior of the process chamber 201 (step (g)). After a predetermined time has elapsed, the supply of the $F_2$ gas and the NO gas toward the interior of the process chamber 201 is stopped while the interior of the process chamber 201 is exhausted, and the gas or the like remaining in the process chamber 201 or the exhaust pipe 231 is removed from the interior of the process chamber 201 or the interior of the exhaust pipe 231 (step (h)). In the third cleaning process, one cycle including steps (g) and (h) is performed a predetermined number of times (one or more times).

By performing the third cleaning process, the $F_2$ gas and the NO gas can be mixed and reacted in the process chamber 201 or the exhaust pipe 231. As a result, FNO or the like can be generated in the process chamber 201 or the exhaust pipe 231, and a mixed gas obtained by adding the FNO or the like to the $F_2$ gas can be brought into contact with the interior of the exhaust pipe 231. This makes it possible to allow an etching reaction to proceed inside the exhaust pipe 231 and to remove the deposits adhering to the interior of the exhaust pipe 231. To avoid over-etching of the inner walls of the nozzles 249a to 249c, it is preferable that the same gas supply system as the aforementioned cleaning gas supply system and the same gas supply system as the aforementioned additive gas supply system are connected to the gas supply pipes 232a and 232c, respectively, and that the nozzle used to supply the $F_2$ gas and the nozzle used to supply the NO gas are different nozzles.

An example of a processing condition in the third cleaning process may be described as follows.

$F_2$ gas supply flow rate: 0.5 to 10 slm
NO gas supply flow rate: 0.5 to 10 slm
$N_2$ gas supply flow rate: 0.01 to 20 slm, preferably 0.01 to 10 slm
Supply time for each gas: 10 to 300 seconds, preferably 20 to 120 seconds
Other processing conditions are the same as the processing conditions of the second cleaning process.

(After-Purge and Atmospheric Pressure Restoration)

After the first to third cleaning processes are completed, the interior of the process chamber 201 is purged according to the same processing procedure as the after-purge in the above-described substrate-processing process (after-purge). Thereafter, the atmosphere in the process chamber 201 is replaced by an inert gas (inert gas replacement), and the pressure in the process chamber 201 is restored to the atmospheric pressure (atmospheric pressure restoration).

(Boat Unloading)

The seal cap 219 is lowered by the boat elevator 115, and the lower end of the manifold 209 is opened. Then, the empty boat 217 is unloaded from the lower end of the manifold 209 to the outside of the reaction tube 203 (boat unloading). When these series of processes are completed, the above-described substrate-processing process is resumed.

(3) Effects According to the Present Embodiments

According to the present embodiments, one or more effects described below may be obtained.

(a) By performing, a predetermined number of times, a cycle including: step (a) of supplying the $F_2$ gas from the nozzle 249b toward the interior of the process chamber 201 in which the wafer 200 has been processed by supplying the HCDS gas from the nozzle 249b to the wafer 200; and step (b) of supplying the NO gas from the nozzle 249b toward the interior of the process chamber 201 in a state in which a part of the $F_2$ gas remains in the nozzle 249b after the supply of the $F_2$ gas is stopped, it is possible to allow the $F_2$ gas remaining in the nozzle 249b and the NO gas supplied into the nozzle 249b to be mixed and reacted in the nozzle 249b in each cycle. Therefore, an etching reaction can be allowed to properly proceed inside the nozzle 249b using an assist action of FNO or the like, and the deposits accumulated inside the nozzle 249b can be removed at a practical rate without causing damage to the inner wall of the nozzle 249b.

(b) In step (b), by supplying the NO gas from the nozzle 249b toward the interior of the process chamber 201 in a state in which a part of the $F_2$ gas remains in the nozzle 249b and in a state in which the interior of the process chamber 201 is exhausted, it is possible to decrease the amount (concentration or partial pressure) of the $F_2$ gas remaining in the nozzle 249b with the lapse of time, i.e., to increase the NO gas/$F_2$ gas volume ratio in the nozzle 249b with the lapse of time. Therefore, it is possible to allow the reaction between the $F_2$ gas and the NO gas in the nozzle 249b to softly proceed, to prevent the etching reaction from excessively proceeding inside the nozzle 249b, and to avoid over-etching of the inner wall of the nozzle 249b.

When the $F_2$ gas and the NO gas are simultaneously supplied from the nozzle 249b into the process chamber 201, the concentration or the partial pressure of the $F_2$ gas in the nozzle 249b is constant, and the reaction between the $F_2$ gas and NO gas in the nozzle 249b may become difficult to softly proceed. As a result, the etching reaction may excessively proceed inside the nozzle 249b, and the inner wall of the nozzle 249b may be over-etched.

(c) In step (b), by supplying the NO gas from the nozzle 249b toward the interior of the process chamber 201 in a state in which a part of the $F_2$ gas remains in the nozzle 249b and in a state in which the interior of the process chamber 201 is exhausted, it becomes possible to move a part of the $F_2$ gas remaining in the nozzle 249b into the process chamber 201. This makes it possible to move the peak point of the reaction between the $F_2$ gas and the NO gas in the nozzle 249b from the base side of the nozzle 249b toward the end side thereof. As a result, the cleaning process inside the nozzle 249b can be caused to evenly proceed in a wide region in the nozzle 249b, preferably throughout the entire region from the base side to the end side of the nozzle 249b. That is to say, it is possible to improve the uniformity of the cleaning process in the nozzle 249b.

When the $F_2$ gas and the NO gas are simultaneously supplied from the nozzle 249b toward the interior of the process chamber 201, the peak point of the reaction between the $F_2$ gas and the NO gas in the nozzle 249b may not be movable, the etching reaction may locally proceed in a portion of the nozzle 249b, and a portion of the inner wall of the nozzle 249b may be locally over-etched.

(d) In step (b), by supplying the NO gas from the nozzle 249b toward the interior of the process chamber 201 in a state in which a part of the $F_2$ gas remains in the nozzle 249b and in a state in which the interior of the process chamber 201 is exhausted, it becomes possible to move a part of the $F_2$ gas remaining in the nozzle 249b into the process chamber 201. Therefore, it becomes possible to move the peak point of the generation amount of the reaction heat generated by the reaction between the $F_2$ gas and the NO gas in the nozzle 249b from the base side of the nozzle 249b toward the end side thereof. As a result, it is possible to suppress a local temperature increase in a portion of the nozzle 249b. This makes it possible to avoid over-etching of a portion of the inner wall of the nozzle 249b by contacting the $F_2$ gas with the interior of the nozzle 249b kept in a high temperature state.

When the $F_2$ gas and the NO gas are simultaneously supplied from the nozzle 249b into the process chamber 201, the peak point of the generation amount of the reaction heat generated by the reaction between the $F_2$ gas and the NO gas in the nozzle 249b may not be movable, and a portion of the nozzle 249b may be locally heated to a high temperature. As a result, the etching reaction may locally proceed in the nozzle 249b, and a portion of the inner wall of the nozzle 249b may be locally over-etched.

(e) In step (b), by supplying the NO gas toward the interior of the process chamber through the gas supply pipe 232b and the nozzle 249b in a state in which the interior of the process chamber 201 is exhausted, even when the $F_2$ gas remains inside the gas supply pipe 232b, it is possible to move a part of the remaining $F_2$ gas from the interior of the gas supply pipe 232b into the process chamber 201. Therefore, even if the reaction between the $F_2$ gas and the NO gas occurs in the gas supply pipe 232b, the peak point of the reaction between the $F_2$ gas and the NO gas in the gas supply pipe 232b, i.e., the peak point of the generation amount of the reaction heat generated by the reaction between the $F_2$ gas and the NO gas, can be moved from the upstream side to the downstream side of the gas supply pipe 232b. As a result, it is possible to avoid a local temperature increase in a portion of the gas supply pipe 232b. This makes it possible to prevent the inner wall of the gas supply pipe 232b from being corroded by the $F_2$ gas coming into contact with the interior of the gas supply pipe 232b kept in a high temperature state.

When the $F_2$ gas and the NO gas are simultaneously supplied into the process chamber 201 through the gas supply pipe 232b and the nozzle 249b, the peak point of the reaction between the $F_2$ gas and the NO gas in the gas supply pipe 232b may not be movable, and a portion of the gas supply pipe 232b may be locally heated to a high temperature. Thus, the etching reaction may locally proceed in the gas supply pipe 232b, and a portion of the inner wall of the gas supply pipe 232b may be locally corroded.

(f) By performing step (c) of removing the NO gas or the like remaining in the nozzle 249b after the supply of the NO gas into the nozzle 249b is stopped and replacing the atmosphere in the nozzle 249b with the $N_2$ gas, when the $F_2$ gas is supplied from the nozzle 249b toward the interior of the process chamber 201 in step (a) of the next cycle, it is possible to prevent the aforementioned etching reaction from unintentionally proceeding in the nozzle 249b.

(g) By properly setting the processing condition in step (c), removing the NO gas and the like remaining in the nozzles 249a and 249c and the process chamber 201 from the interiors of the nozzles 249a and 249c and the interior of the process chamber 201, respectively, and replacing the atmospheres in the nozzles 249a and 249c and the process chamber 201 with the $N_2$ gas, it is possible to prevent each of the aforementioned etching reactions from unintentionally proceeding in the nozzles 249a and 249c and the process chamber 201.

(h) By performing step (c) of removing the NO gas or the like remaining in the nozzle 249b after the supply of the NO gas into the nozzle 249b is stopped and replacing the atmosphere in the nozzle 249b with the $N_2$ gas, it is possible to properly lower the temperature of the nozzle 249b which has risen due to the reaction heat of the $F_2$ gas and the NO gas. Therefore, when the $F_2$ gas is supplied from the nozzle 249b toward the interior of the process chamber 201 in step (a) of the next cycle, it is possible to prevent the inner wall of the nozzle 249b from being over-etched by contacting the $F_2$ gas with the interior of the nozzle 249b kept in a high temperature state.

(i) By performing the $F_2$ gas supply step while the supply of the $N_2$ gas into the nozzle 249b is stopped, it is easy to suppress the movement of the $F_2$ gas from the interior of the nozzle 249b into the process chamber 201 and to leave a part of the $F_2$ gas inside the nozzle 249b.

Further, the $F_2$ gas supply step may be performed in a state in which the $N_2$ gas is supplied into the nozzle 249b. In this case, it becomes easy to reduce the concentration of the $F_2$ gas supplied into the nozzle 249b to a desired concentration.

Furthermore, by performing the $F_2$ gas supply step while the supply of the $N_2$ gas into the nozzles 249a and 249c is stopped, it is possible to allow the $F_2$ gas to intrude (reversely diffuse) into the nozzles 249a and 249c, whereby, as described below, the cleaning process in the nozzles 249a and 249c can be caused to proceed in parallel when the cleaning process in the nozzle 249b is performed.

In addition, the $F_2$ gas supply step may be performed in a state in which the $N_2$ gas is supplied into the nozzles 249a and 249c. In this case, it is possible to suppress the intrusion of the $F_2$ gas into the nozzles 249a and 249c, and to suppress the progress of the cleaning process in the nozzles 249a and 249c when performing the cleaning process in the nozzle 249b.

(j) By performing the NO gas supply step while the APC valve 244 is opened to exhaust the interior of the process chamber 201, it is possible to promote the movement of the $F_2$ gas remaining in the nozzle 249b into the process chamber 201. Therefore, it is possible to reliably obtain the aforementioned effect of increasing the NO gas/$F_2$ gas volume ratio with the lapse of time, the aforementioned effect of moving the peak point of the reaction between the $F_2$ gas and the NO gas, and the aforementioned effect of moving the peak point of the generation amount of the reaction heat generated by the reaction between the $F_2$ gas and the NO gas.

Further, the NO gas supply step may be performed in a state in which the APC valve 244 is closed to stop the exhaust of the interior of the process chamber 201. In this case, it is possible to properly suppress the movement of the $F_2$ gas remaining in the nozzle 249b into the process chamber 201, and to properly reduce the movement speed of the peak point of the reaction between the $F_2$ gas and the NO gas. As a result, in the nozzle 249b, it is possible to enhance the effect of removing the deposits in the region through which the peak point of the reaction passes.

In addition, by performing the NO gas supply step while the supply of the $N_2$ gas into the nozzle 249b is stopped, it is possible to properly suppress the movement of the $F_2$ gas remaining in the nozzle 249 b into the process chamber 201, and to properly reduce the movement speed of the peak point of the reaction between the $F_2$ gas and the NO gas. As a result, in the nozzle 249b, it is possible to enhance the effect of removing the deposits in the region through which the peak point of the reaction passes.

Further, the NO gas supply step may be performed in a state in which the $N_2$ gas is supplied into the nozzle 249b. In this case, it is possible to promote the movement of the $F_2$ gas remaining in the nozzle 249b into the process chamber 201. Therefore, it is possible to reliably obtain the aforementioned effect of increasing the NO gas/$F_2$ gas volume ratio with the lapse of time, the aforementioned effect of moving the peak point of the reaction between the $F_2$ gas and the NO gas, and the aforementioned effect of moving the peak point of the generation amount of the reaction heat generated by the reaction between the $F_2$ gas and the NO gas.

Furthermore, by performing the NO gas supply step while the supply of the $N_2$ gas into the nozzles 249a and 249c is stopped, it is possible to allow the NO gas to intrude (reversely diffuse) into the nozzles 249a and 249c. Thus, it becomes possible to allow the $F_2$ gas intruded into the nozzles 249a and 249c by performing step (a) to react with the NO gas intruded into the nozzles 249a and 249c by performing step (b). As a result, FNO or the like can be generated in the nozzles 249a and 249c, and a mixed gas obtained by adding the FNO or the like to the $F_2$ gas can be brought into contact with the interiors of the nozzles 249a and 249c. Therefore, the etching reaction can be allowed to proceed inside the nozzles 249a and 249c, and the deposits adhering to the interiors of the nozzles 249a and 249c can be removed. That is to say, when the cleaning process in the nozzle 249b is performed, it is possible to allow the cleaning process in the nozzles 249a and 249c to proceed in parallel.

The NO gas supply step may be performed in a state in which the $N_2$ gas is supplied into the nozzles 249a and 249c. In this case, it is possible to suppress the intrusion of the NO gas into the nozzles 249a and 249c, and to suppress the progress of the cleaning process in the nozzles 249a and 249c.

(k) By performing the first cleaning process, the mixed gas obtained by adding the FNO or the like to the $F_2$ gas can be brought into contact with the interior of the process chamber 201 or the interior of the exhaust pipe 231 as well as the interior of the nozzle 249b, and at least a part of the deposits adhering to the interior of the process chamber 201 or the exhaust pipe 231 can also be removed. If a part of the deposits adhering to the interior of the process chamber 201 remains in the process chamber 201 after the first cleaning process is performed, it is possible to remove the deposits remaining in the process chamber 201 by performing the second cleaning process as needed. Furthermore, if a part of the deposits adhering to the interior of the exhaust pipe 231 is not removed but remains in the exhaust pipe 231 after the first cleaning process is performed, it is possible to remove the deposits remaining in the exhaust pipe 231 by performing the third cleaning process as needed.

(l) The above-described effects can be similarly obtained even when a cleaning gas other than the $F_2$ gas, an additive gas other than the NO gas, or an inert gas other than the $N_2$ gas is used in the cleaning process. Furthermore, the above-described effects can be similarly obtained when a processing gas (precursor) other than HCDS gas, a processing gas (reactant) other than the $NH_3$ gas, or an inert gas other than the $N_2$ gas is used in the substrate-processing process.

(5) Modification Examples

The first cleaning process is not limited to the embodiments shown in FIG. 4A, and may be modified as the following modification examples. These modification examples may be arbitrarily combined. Unless otherwise stated, the processing procedure and the processing condition in each step of each modification example may be the same as the processing procedure and the processing condition in each step shown in FIG. 4A.

Modification Example 1

As can be seen in FIG. 4B and the gas supply sequence described below, a cycle may be performed a predetermined number of times (n times where n is an integer of 1 or more), the cycle including: step (a) of supplying the NO gas from the nozzle 249b toward the interior of the process chamber 201 in which the wafer 200 has been processed by supplying the HCDS gas from the nozzle 249b to the wafer 200; and step (b) of supplying the $F_2$ gas from the interior of the nozzle 249b toward the interior of the process chamber 201 in a state in which a part of the NO gas remains in the nozzle 249b after the supply of the NO gas is stopped. Also in step (a) of this modification example, as the first cleaning process shown in FIG. 4A, a pressure regulation step indicated by $a_0$ in FIG. 4B is performed before the NO gas is supplied.

Furthermore, a residual gas removal step indicated by c in FIG. 4B is performed after stopping the supply of the $F_2$ gas.

$$(N_2\text{-Press.set}\rightarrow NO\rightarrow F_2\rightarrow PRG)\times n \qquad R2:$$

Also in this modification example, the same effects as those of the first cleaning process shown in FIG. 4A may be obtained.

That is to say, in this modification example, the NO gas remaining in the nozzle 249b and the $F_2$ gas supplied into the nozzle 249b can be mixed and reacted in the nozzle 249b. As a result, by using the assisting action of FNO or the like, it is possible to allow an etching reaction to proceed in the nozzle 249b and to remove the deposits accumulated in the nozzle 249b at a practical rate.

Furthermore, in this modification example, the aforementioned etching reaction can be caused to proceed while a part of the NO gas remaining in the nozzle 249b is moved into the process chamber 201. That is to say, it is possible to allow the aforementioned etching reaction to proceed while the amount (concentration or partial pressure) of the NO gas remaining in the nozzle 249b is decreased with the lapse of time. In other words, the aforementioned etching reaction can be allowed to proceed while the volume ratio of the $F_2$ gas to the NO gas (hereinafter also referred to as $F_2$ gas/NO gas volume ratio) in the nozzle 249b is increased with the lapse of time. Therefore, it is possible to allow the reaction between the NO gas and the $F_2$ gas in the nozzle 249b to softly proceed, to prevent the etching reaction from excessively proceeding inside the nozzle 249b, and to avoid over-etching of the inner wall of the nozzle 249b.

Furthermore, in this modification example, it is possible to move the peak point of the reaction between the NO gas and the $F_2$ gas in the nozzle 249b from the base side of the nozzle 249b toward the end side thereof. As a result, the cleaning process inside the nozzle 249b can be caused to evenly proceed in a wide region in the nozzle 249b, preferably throughout the entire region from the base side to the end side of the nozzle 249b. That is to say, it is possible to improve the uniformity of the cleaning process in the nozzle 249b.

Furthermore, in this modification example, the peak point of the generation amount of the reaction heat generated by the reaction between the NO gas and the $F_2$ gas in the nozzle 249b can be moved from the base side of the nozzle 249b toward the end side thereof. As a result, it is possible to suppress a local temperature increase in a portion of the nozzle 249b. This makes it possible to avoid over-etching of a portion of the inner wall of the nozzle 249b which may be caused by the $F_2$ gas coming into contact with the interior of the nozzle 249b kept in a high temperature state in step (a) of the next cycle.

Modification Example 2

Figure 5A:
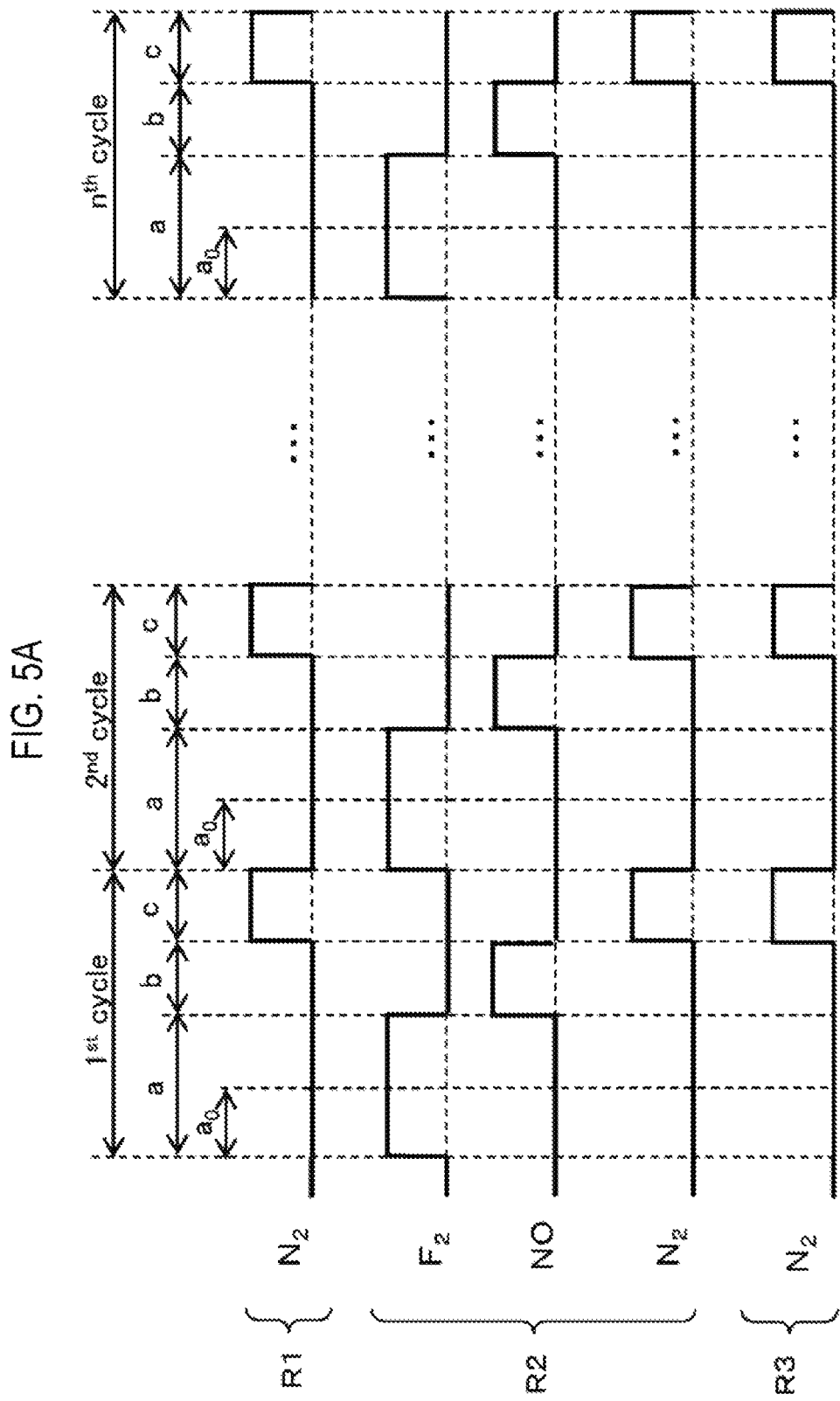

As can be seen in FIG. 5A and the gas supply sequence indicated below, in a pressure regulation step indicated by $a_0$ in FIG. 5A, the pressure in the process chamber 201 may be regulated using the $F_2$ gas, and the process chamber 201 may be filled with the $F_2$ gas.

$$(F_2\text{-Press.set}\rightarrow F_2\rightarrow NO\rightarrow PRG)\times n \qquad R2:$$

Also in this modification example, the same effects as those of the first cleaning process shown in FIG. 4A and the modification example described above may be obtained. Furthermore, in step (a) of this modification example, the pressure in the process chamber 201 is regulated using the $F_2$ gas, and the process chamber 201 is filled with the $F_2$ gas, which makes it easy to leave a part of the $F_2$ gas in the nozzle 249b. As a result, when step (b) is subsequently performed, the $F_2$ gas remaining in the nozzle 249b and the NO gas supplied into the nozzle 249b can be efficiently mixed and reacted in the nozzle 249b, and the deposits accumulated in the nozzle 249b can be efficiently removed. Furthermore, the processing procedure in step (a) can be simplified. Moreover, according to this modification example, in step (a), the $F_2$ gas is filled in the entire process chamber 201. Therefore, it is possible to enhance the removal efficiency (effect) of the deposits accumulated not only inside the nozzle 249b but also inside the nozzles 249a and 249c, the process chamber 201, and the exhaust pipe 231.

In the pressure regulation step, the pressure in the process chamber 201 may be regulated using both the $F_2$ gas and the $N_2$ gas. In this case, in addition to the above-described effects, it is possible to shorten the time required until the pressure in the process chamber 201 reaches a processing pressure.

Modification Example 3

As can be seen in FIG. 5B and the gas supply sequence indicated below, in the pressure regulation step indicated by $a_0$ in FIG. 5B, the pressure in the process chamber 201 may be regulated using the NO gas, and the process chamber 201 may be filled with the NO gas.

(NO-Press.set→NO→$F_2$→PRG)×n            R2:

Also in this modification example, the same effects as those of the first cleaning process shown in FIG. 4A and each of the modification examples described above may be obtained. Furthermore, in step (a) of this modification example, the pressure in the process chamber 201 is regulated using the NO gas, and the interior of the process chamber 201 is filled with the NO gas, which makes it easy to leave a part of the NO gas in the nozzle 249b. As a result, when step (b) is subsequently performed, the NO gas remaining in the nozzle 249b and the $F_2$ gas supplied into the nozzle 249b can be efficiently mixed and reacted in the nozzle 249b, and the deposits accumulated in the nozzle 249b can be efficiently removed. Furthermore, the processing procedure in step (a) can be simplified. Moreover, according to this modification example, in step (a), the NO gas is filled in the entire process chamber 201. Therefore, it is possible to enhance the removal efficiency (effect) of the deposits accumulated not only inside the nozzle 249b but also inside the nozzles 249a and 249c, the process chamber 201, and the exhaust pipe 231.

In the pressure regulation step, the pressure in the process chamber 201 may be regulated using both the NO gas and the $F_2$ gas. In this case, in addition to the above-described effects, it is possible to shorten the time required until the pressure in the process chamber 201 reaches a processing pressure.

Modification Example 4

In the above-described embodiments, there has been described an example where the $F_2$ gas supply step is performed in a state in which the APC valve 244 is opened to exhaust the interior of the process chamber 201. However, the $F_2$ gas supply step may be performed in a state in which the APC valve 244 is closed to stop the exhaust of the interior of the process chamber 201. Also in this modification example, the same effects as those of the first cleaning process shown in FIG. 4A and each of the modification examples described above may be obtained. Furthermore, in this modification example, it is easy to suppress the movement of the $F_2$ gas from the interior of the nozzle 249b to the interior of the process chamber 201 and to leave a part of the $F_2$ gas in the nozzle 249b.

Modification Example 5

A gas supply system similar to the aforementioned cleaning gas supply system and a gas supply system similar to the aforementioned additive gas supply system may be connected to the gas supply pipe 232a, and the cleaning process of the interior of the nozzle 249a may be performed according to, for example, the gas supply sequences indicated below.

($N_2$-Press.set→$F_2$→NO→PRG)×n            R1:

($N_2$-Press.set→NO→$F_2$→PRG)×n            R1:

($F_2$-Press.set→$F_2$→NO→PRG)×n            R1:

(NO-Press.set→NO→$F_2$→PRG)×n            R1:

According to this modification example, it is possible to remove the deposits adhering to the interior of the nozzle 249a. In this case, the same effects as those of the first cleaning process shown in FIG. 4A and each of the modification examples described above may be obtained.

Modification Example 6

A gas supply system similar to the aforementioned cleaning gas supply system and a gas supply system similar to the aforementioned additive gas supply system may be connected to the gas supply pipe 232c, and the cleaning process of the interior of the nozzle 249c may be performed according to, for example, the gas supply sequences indicated below.

($N_2$-Press.set $F_2$→NO→PRG)×n            R3:

($N_2$-Press.set→NO→$F_2$→PRG)×n            R3:

($F_2$-Press.set $F_2$→NO→PRG)×n            R3:

(NO-Press.set→NO→$F_2$→PRG)×n            R3:

According to this modification example, it is possible to remove the deposits adhering to the interior of the nozzle 249c. In this case, the same effects as those of the first cleaning process shown in FIG. 4A and each of the modification examples described above may be obtained.

Modification Example 7

A gas supply system similar to the aforementioned cleaning gas supply system and a gas supply system similar to the aforementioned additive gas supply system may be connected to at least one selected from the group of the gas supply pipes 232a and 232c, and the cleaning processes in at least two or more selected from the group of the nozzles 249a to 249c may be sequentially performed according to, for example, the procedure of the first cleaning process shown in FIG. 4A or each of the modification examples described above.

At this time, the implementation order of the cleaning processes in the nozzles 249a to 249c may be arbitrarily determined. For example, the cleaning process may be performed in the order of R2→R1, the cleaning process may be performed in the order of R2→R3, or the cleaning process may be performed in the order of R2→R1→R3.

According to this modification example, it is possible to remove the deposits adhering to the interiors of at least two or more nozzles selected from the group of the nozzles 249a to 249c. In this case, the same effects as those of the first cleaning process shown in FIG. 4A or each of the modification examples described above may be obtained.

Modification Example 8

A gas supply system similar to the aforementioned cleaning gas supply system and a gas supply system similar to the aforementioned additive gas supply system may be connected to the gas supply pipes 232a and 232c, respectively, and the cleaning processes in at least two or more nozzles selected from the group of the nozzles 249a to 249c may be simultaneously performed according to, for example, the gas supply sequences indicated below.

$(N_2\text{-Press.set} \to F_2 \to NO \to PRG) \times n$      R1:

$(N_2\text{-Press.set} \to F_2 \to NO \to PRG) \times n$      R3:

$(N_2\text{-Press.set} \to NO \to F_2 \to PRG) \times n$      R1:

$(N_2\text{-Press.set} \to NO \to F_2 \to PRG) \times n$      R3:

$(N_2\text{-Press.set} \to F_2 \to NO \to PRG) \times n$      R1:

$(N_2\text{-Press.set} \to F_2 \to NO \to PRG) \times n$      R2:

$(N_2\text{-Press.set} \to F_2 \to NO \to PRG) \times n$      R3:

$(N_2\text{-Press.set} \to NO \to F_2 \to PRG) \times n$      R1:

$(N_2\text{-Press.set} \to NO \to F_2 \to PRG) \times n$      R2:

$(N_2\text{-Press.set} \to NO \to F_2 \to PRG) \times n$      R3:

According to this modification example, it is possible to remove the deposits adhering to the interiors of at least two or more nozzles selected from the group of the nozzles 249a to 249c. In this case, the same effects as those of the first cleaning process shown in FIG. 4A or each of the modification examples described above may be obtained. In addition, since the cleaning processes in the plurality of nozzles are performed simultaneously, it is possible to shorten the time required for the cleaning processes.

Modification Example 9

A gas supply system similar to the aforementioned cleaning gas supply system and a gas supply system similar to the aforementioned additive gas supply system may be connected to at least one selected from the group of the gas supply pipes 232a and 232c, and the cleaning process in the nozzles 249a and 249b or the cleaning process in the nozzles 249b and 249c may be simultaneously performed according to, for example, the gas supply sequences indicated below.

$(N_2\text{-Press.set} \to NO \to F_2 \to PRG) \times n$      R1:

$(N_2\text{-Press.set} \to F_2 \to NO \to PRG) \times n$      R2:

$(N_2\text{-Press.set} \to F_2 \to NO \to PRG) \times n$      R2:

$(N_2\text{-Press.set} \to NO \to F_2 \to PRG) \times n$      R3:

$(N_2\text{-Press.set} \to F_2 \to NO \to PRG) \times n$      R1:

$(N_2\text{-Press.set} \to NO \to F_2 \to PRG) \times n$      R2:

$(N_2\text{-Press.set} \to NO \to F_2 \to PRG) \times n$      R2:

$(N_2\text{-Press.set} \to F_2 \to NO \to PRG) \times n$      R3:

That is to say, in step (a), when the $F_2$ gas is supplied from the nozzle 249b into the process chamber 201, the NO gas may be supplied from the nozzle 249a or the nozzle 249c different from the nozzle 249b into the process chamber 201. Furthermore, in step (b), when the NO gas is supplied from the nozzle 249b into the process chamber 201 in a state in which a part of the $F_2$ gas remains in the nozzle 249b, the $F_2$ gas may be supplied from the nozzle 249a or the nozzle 249c into the process chamber 201 in a state in which a part of the NO gas remains in the nozzle 249a or the nozzle 249c after the supply of the NO gas is stopped, in step (b).

Furthermore, in step (a), when the NO gas is supplied from the nozzle 249b into the process chamber 201, the $F_2$ gas may be supplied from the nozzle 249a or the nozzle 249c different from the nozzle 249b into the process chamber 201. Furthermore, in step (b), when the $F_2$ gas is supplied from the nozzle 249b into the process chamber 201 in a state in which a part of the NO gas remains in the nozzle 249b, the NO gas may be supplied from the nozzle 249a or the nozzle 249c into the process chamber 201 in a state in which a part of the $F_2$ gas remains in the nozzle 249a or the nozzle 249c after the supply of the $F_2$ gas is stopped, in step (b).

According to this modification example, it is possible to remove the deposits adhering to the interiors of the nozzles 249a and 249b, and to remove the deposits adhering to the interiors of the nozzles 249b and 249c. In these cases, the same effects as those of the first cleaning process shown in FIG. 4A or each of the modification examples described above may be obtained. In addition, since the cleaning processes in the plurality of nozzles are performed simultaneously, it is possible to shorten the time required for the cleaning processes.

Furthermore, according to this modification example, the $F_2$ gas and the NO gas are simultaneously supplied into the process chamber 201 in any of steps (a) and (b). Therefore, it is possible to efficiently generate FNO or the like in the process chamber 201. As a result, it is possible to reliably perform an operation in which a mixed gas obtained by adding the FNO or the like to the $F_2$ gas is reversely diffused into and brought into contact with the nozzle that does not supply the $F_2$ gas or the NO gas, or an operation in which a mixed gas obtained by adding the FNO or the like to the $F_2$ gas is diffused into and brought into contact with the process chamber 201 or the exhaust pipe 231. That is to say, it is possible to simultaneously and efficiently perform the cleaning process in the nozzle that supplies the $F_2$ gas or the NO gas, the cleaning process in the nozzle that does not supply the $F_2$ gas or the NO gas, the cleaning process in the process chamber 201, and the cleaning process in the exhaust pipe 231.

Modification Example 10

Figure 6:
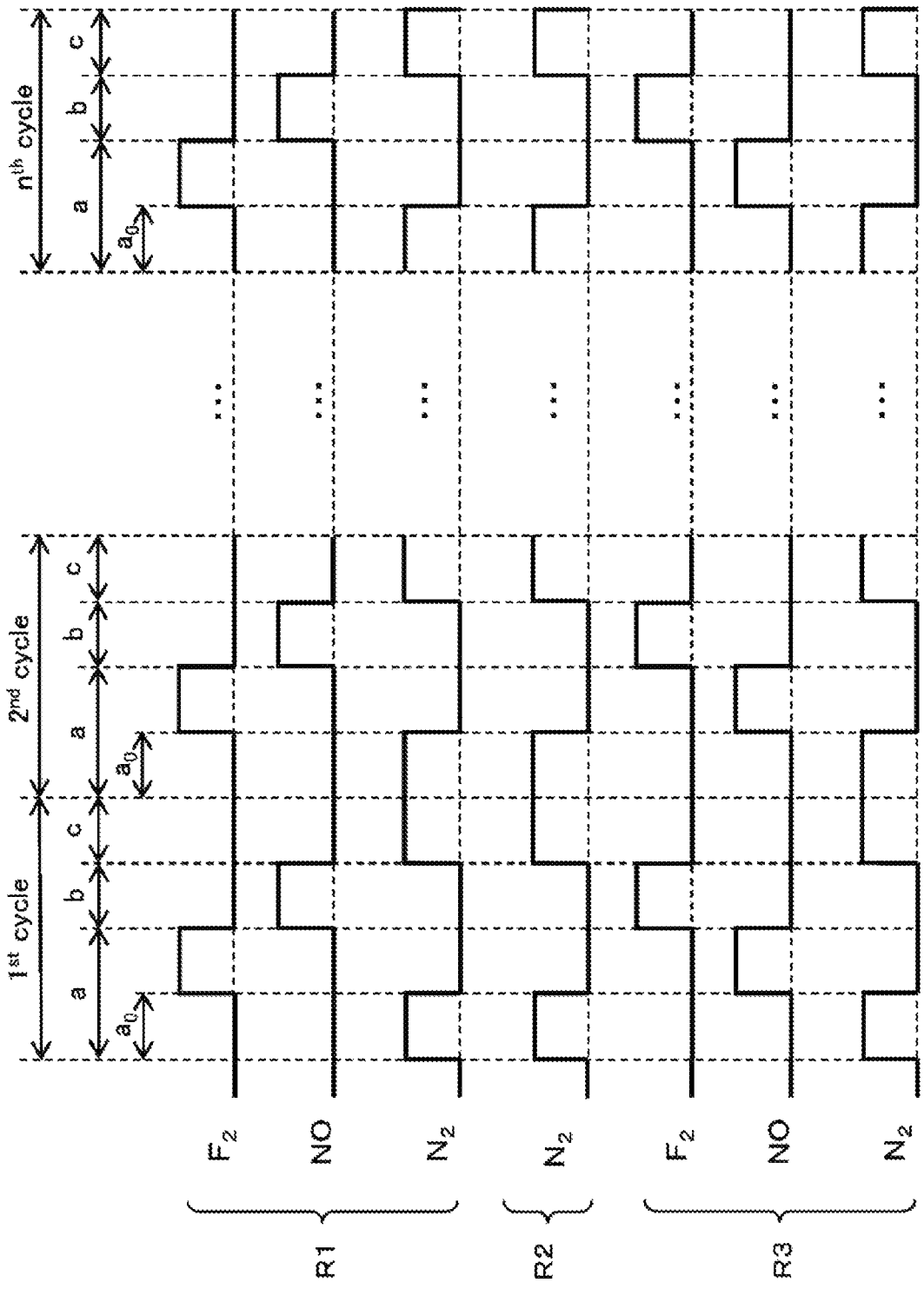
FIG. 6 is a diagram showing a modification example of the gas supply sequence of the first cleaning process according to embodiments of the present disclosure.

A gas supply system similar to the aforementioned cleaning gas supply system and a gas supply system similar to the aforementioned additive gas supply system may be connected to the gas supply pipes 232a and 232c, respectively, and the cleaning processes in the nozzles 249a and 249c may be simultaneously performed according to, for example, the gas supply sequences shown in FIG. 6 and described below.

$(N_2\text{-Press.set} \to F_2 \to NO \to PRG) \times n$      R1:

$(N_2\text{-Press.set} \to NO \to F_2 \to PRG) \times n$      R3:

| | |
|---|---|
| (N$_2$-Press.set→NO→F$_2$→PRG)×n | R1: |
| (N$_2$-Press.set→F$_2$→NO→PRG)×n | R3: |

According to this modification example, it is possible to remove the deposits adhering to the interiors of the nozzles 249a and 249c. In these cases, the same effects as those of the first cleaning process shown in FIG. 4A or each of the modification examples described above may be obtained. In addition, since the cleaning processes in the plurality of nozzles are performed simultaneously, it is possible to shorten the time required for the cleaning processes.

Furthermore, according to this modification example, the F$_2$ gas and the NO gas are simultaneously supplied into the process chamber 201 in any of steps (a) and (b). Therefore, the same effects as those of modification example 9 may be obtained.

Modification Example 11

Figure 7:
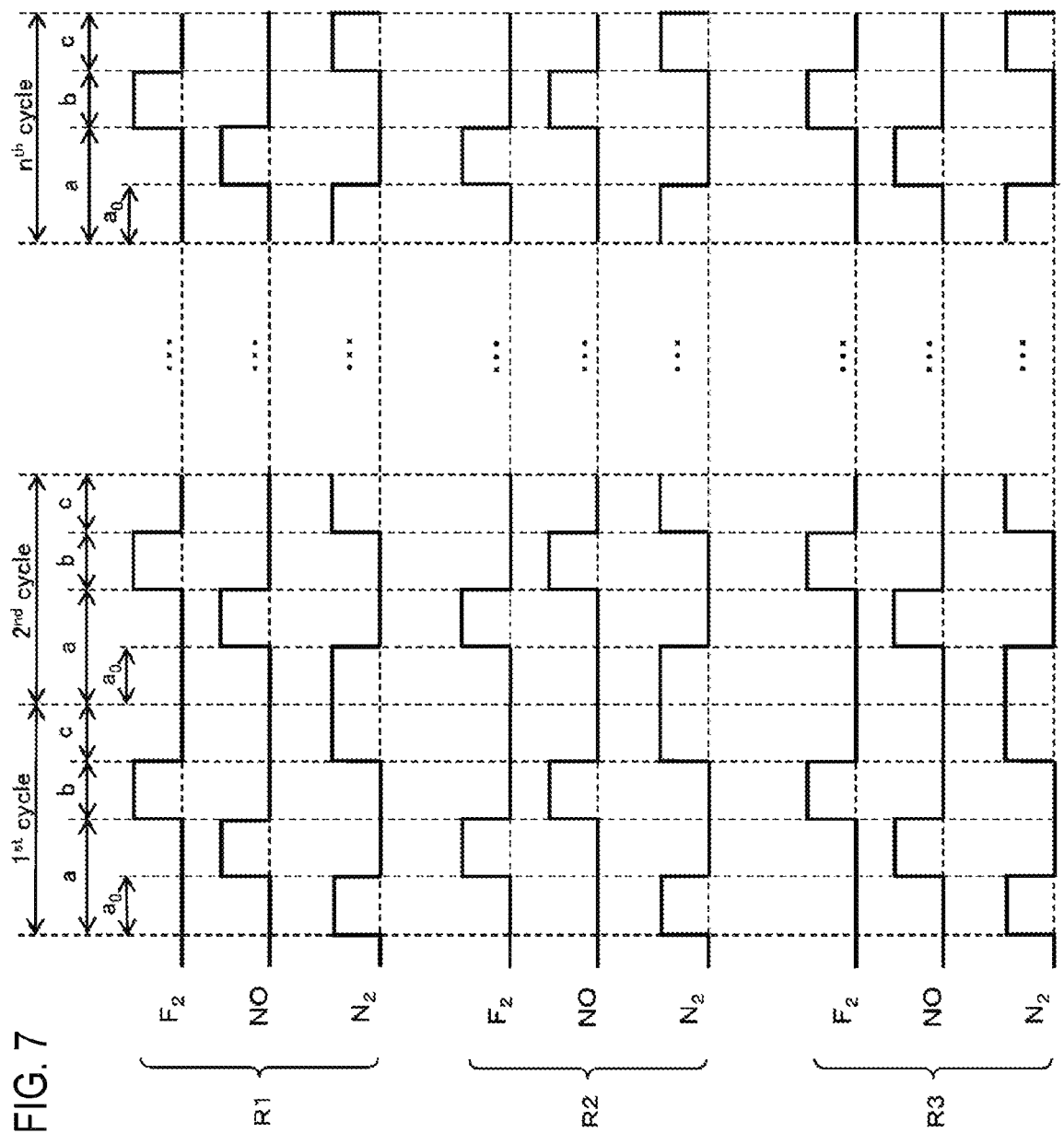
FIG. 7 is a diagram showing a modification example of the gas supply sequence of the first cleaning process according to embodiments of the present disclosure.

A gas supply system similar to the aforementioned cleaning gas supply system and a gas supply system similar to the aforementioned additive gas supply system may be connected to the gas supply pipes 232a and 232c, respectively, and the cleaning processes in the nozzles 249a to 249c may be simultaneously performed according to, for example, the gas supply sequences shown in FIG. 7 and described below.

| | |
|---|---|
| (N$_2$-Press.set→NO→F$_2$→PRG)×n | R1: |
| (N$_2$-Press.set→F$_2$→NO→PRG)×n | R2: |
| (N$_2$-Press.set→NO→F$_2$→PRG)×n | R3: |
| (N$_2$-Press.set→F$_2$→NO→PRG)×n | R1: |
| (N$_2$-Press.set→NO→F$_2$→PRG)×n | R2: |
| (N$_2$-Press.set→F$_2$→NO→PRG)×n | R3: |

According to this modification example, it is possible to remove the deposits adhering to the interiors of the nozzles 249a to 249c. In this case, the same effects as those of the first cleaning process shown in FIG. 4A or each of the modification example s described above may be obtained. In addition, since the cleaning processes in the plurality of nozzles are performed simultaneously, it is possible to shorten the time required for the cleaning processes.

Furthermore, according to this modification example, the F$_2$ gas and the NO gas are simultaneously supplied into the process chamber 201 in any of steps (a) and (b). Therefore, the same effects as those of modification example 9 may be obtained.

Modification Example 12

The implementation timing of step (c) is not limited to the timing illustrated in the first cleaning process shown in FIG. 4A or each of the modification examples described above. For example, as the gas supply sequences indicated below, step (c) may be performed only in the last cycle of the first cleaning process, or step (c) may be performed every time the cycle is performed a predetermined number of times. Note that each of n and n$_1$ to n$_3$ denoted below is an integer of 1 or larger.

| | |
|---|---|
| (N$_2$-Press.set→F$_2$→NO)×n→PRG | R2: |
| (N$_2$-Press.set→NO→F$_2$)×n→PRG | R2: |
| (F$_2$-Press.set→F$_2$→NO)×n→PRG | R2: |
| (NO-Press.set→NO→F$_2$)×n→PRG | R2: |
| [[(N$_2$-Press.set→F$_2$→NO)×n$_1$→PRG]×n$_2$]×n$_3$ | R2: |
| [[(N$_2$-Press.set→NO→F$_2$)×n$_1$→PRG]×n$_2$]×n$_3$ | R2: |
| [[(F$_2$-Press.set→F$_2$→NO)×n$_1$→PRG]×n$_2$]×n$_3$ | R2: |
| [[(NO-Press.set→NO→F$_2$)×n$_1$→PRG]×n$_2$]×n$_3$ | R2: |

According to this modification example, the same effects as those of the first cleaning process shown in FIG. 4A or each of the modification examples described above may be obtained. In addition, by reducing the implementation frequency of step (c), it becomes possible to shorten the time required for the cleaning processes.

Modification Example 13

The first to third cleaning processes described above may be implemented in any order as described below. Furthermore, two processes including the first cleaning process may be arbitrarily selected from among the first to third cleaning processes described above, and may be implemented in any order.

First cleaning process→second cleaning process→third cleaning process
First cleaning process→third cleaning process→second cleaning process
Second cleaning process→first cleaning process→third cleaning process
Second cleaning process→third cleaning process→first cleaning process
Third cleaning process→first cleaning process→second cleaning process
Third cleaning process→second cleaning process→first cleaning process
First cleaning process→second cleaning process
First cleaning process→third cleaning process
Second cleaning process→first cleaning process
Third cleaning process→first cleaning process According to this modification example, the same effects as those of the first cleaning process shown in FIG. 4A or each of the modification examples described above may be obtained. In the first cleaning process or the second cleaning process, it is possible to perform the cleaning process in the exhaust pipe 231. Therefore, by performing the first cleaning process and the second cleaning process prior to the third cleaning process, it is possible to shorten the time required for the third cleaning process.

Modification Example 14

In the embodiments and each of the modification examples described above, there has been described an example where the pressure regulation step is performed using any one of an N$_2$ gas, an F$_2$ gas, an NO gas, an F$_2$ gas+an N$_2$ gas, and an NO gas+an N$_2$ gas in the first cleaning process. However, in the second cleaning process and the third cleaning process, the pressure regulation step may be performed using at least one selected from the group of an N$_2$ gas, an F$_2$ gas, and an NO gas. The effect of regulating the pressure in the process chamber 201 using any one of an F$_2$ gas, an NO gas, an F$_2$ gas+an N$_2$ gas, and an NO gas+an $N_2$ gas in the second cleaning process and the third cleaning process is the same as the effect in modification examples 2 and 3 described above.

When the pressure regulation in the process chamber 201 is performed using an $F_2$ gas+an NO gas+an $N_2$ gas in the second cleaning process or the third cleaning process, the same effects as those obtainable when the pressure regulation is performed using an $F_2$ gas+an $N_2$ gas or an NO gas+an $N_2$ gas may be obtained. In addition, since an $F_2$ gas and an NO gas can be mixed and reacted in the process chamber 201 or in the exhaust pipe 231 from the time of pressure regulation, it is possible to perform the cleaning process in the process chamber 201 or in the exhaust pipe 231 from the time of pressure regulation. This makes it possible to shorten the time required for each of the cleaning processes (the second cleaning process and the third cleaning process). When the pressure regulation in the process chamber 201 is performed using an $F_2$ gas+an NO gas in the second cleaning process or the third cleaning process, it is possible to further enhance the latter effect, i.e., the effect of shortening the time required for each of the cleaning processes, among the above-described effects obtained when the pressure regulation is performed using an $F_2$ gas+an NO gas+an $N_2$ gas.

Other Embodiments

Embodiments of the present disclosure have been specifically described above. However, the present disclosure is not limited to the above-described embodiments. Various modification examples may be made without departing from the scope of the present disclosure.

In the above-described embodiments, there has been described an example where the interior of the nozzle or the interior of the process container is cleaned after the SiN film is formed over the wafer in the process container. However, the present disclosure is not limited to such embodiments. For example, the cleaning processes described above may be suitably applied to a case where the interior of the nozzle or the interior of the process container is cleaned after various films including silicon-based insulating films such as a silicon oxide film (SiO film), a silicon oxycarbonitride film (SiOCN film), a silicon oxycarbide film (SiOC film), a silicon oxynitride film (SiON film), a silicon carbonitride film (SiCN film), a silicon borocarbonitride film (SiBCN film), a silicon boronitride film (SiBN film), and the like are formed over the wafer in the process container.

It is preferable that the recipes used for the substrate-processing process or the cleaning processes are individually prepared according to the processing contents and are stored in the memory device 121c via the electric communication line or the external memory device 123. When the substrate-processing process or the cleaning process is started, it is preferable that the CPU 121a appropriately selects an appropriate recipe from the plurality of recipes stored in the memory device 121c according to the contents of the substrate-processing process or the cleaning processes. This makes it possible to form films of various film types, composition ratios, film qualities and film thicknesses with high reproducibility in one substrate-processing apparatus. Furthermore, an appropriate cleaning process can be performed depending on the deposits including various films adhering to the interior of the process container (process chamber 201) or the interior of the supply part (nozzle). In addition, it is possible to reduce the burden on an operator and to quickly start a process while operation errors are avoided.

The above-described recipes are not limited to the case of newly creating them, but may be prepared by, for example, changing the existing recipes already installed in the substrate-processing apparatus. In the case of changing the recipes, the changed recipes may be installed in the substrate-processing apparatus via an electric communication line or a recording medium in which the recipes are recorded. In addition, by operating the input/output device 122 provided in the existing substrate-processing apparatus, the existing recipes already installed in the substrate-processing apparatus may be directly changed.

In the above-described embodiments, there has been described an example where the first to third nozzles (nozzles 249a to 249c) as the first to third supply parts are provided linearly so as to extend from the lower portion to the upper portion of the inner wall of the reaction tube 203. However, the present disclosure is not limited to the embodiments described above. For example, at least one selected from the group of the first to third nozzles may be configured as a U-shaped nozzle (return nozzle) having a portion (a bending portion) bent in, for example, a U-shape at any position between the lower and upper portions of the inner wall of reaction tube 203. Even in the case of using the U-shaped nozzle, by using an assisting action of FNO or the like, it is possible to remove the deposits accumulated in the nozzle at a practical rate in the entire region from the base side to the end side of the nozzle. In addition, it is possible to improve the uniformity of the cleaning process while over-etching of the inner wall of the nozzle is avoided.

Figure 8A:
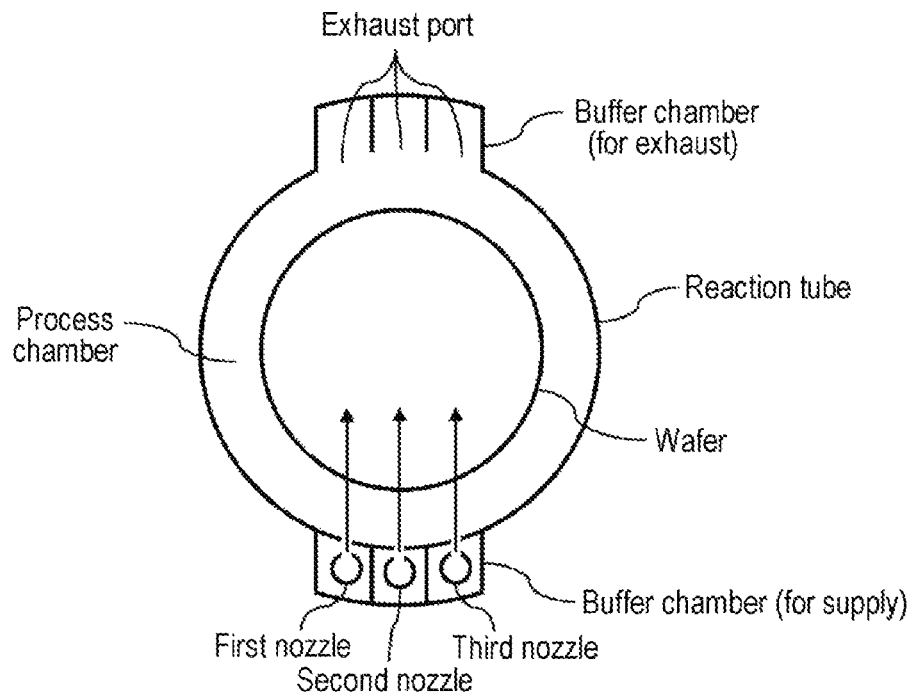
FIGS. 8A and 8B are horizontal sectional diagrams showing modification examples of the vertical process furnace, in which a reaction tube, a buffer chamber, a nozzle and the like are shown in a partially extracted state.
Figure 8B:
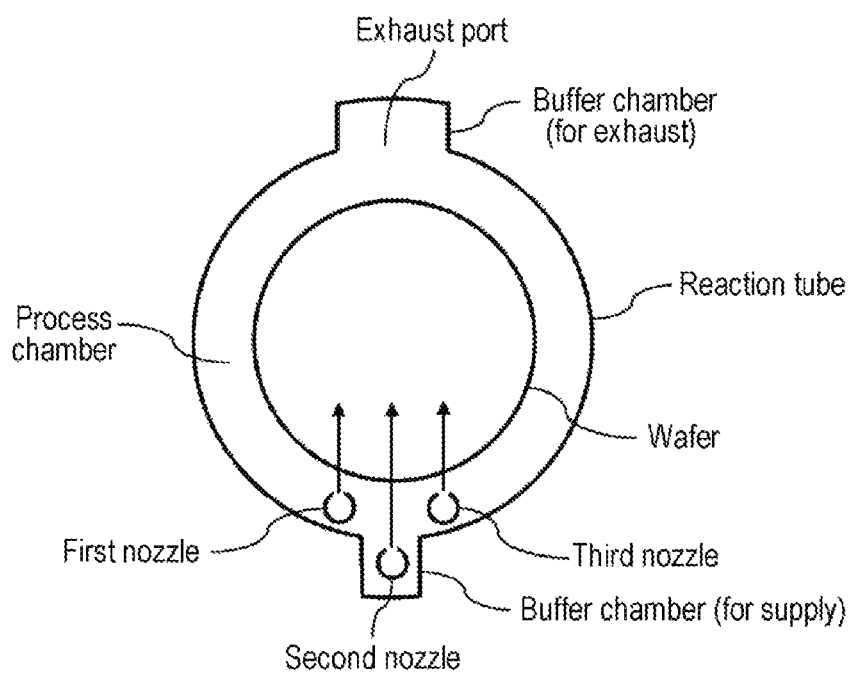

In the above-described embodiments, there has been described an example where the first to third nozzles (nozzles 249a to 249c) as the first to third supply parts are provided in the process chamber so as to extend along the inner wall of the reaction tube. However, the present disclosure is not limited to the embodiments described above. For example, as can be noted from the cross-sectional structure of the vertical process furnace shown in FIG. 8A, a buffer chamber may be provided at the side wall of the reaction tube, and first to third second nozzles having the same configuration as the above-described embodiments may be disposed in the same arrangement as the above-described embodiments. In FIG. 8A, there is shown an example where a supply-purpose buffer chamber and an exhaust-purpose buffer chamber are provided at the side wall of the reaction tube and are disposed at positions facing each other across the wafers. Each of the supply-purpose buffer chamber and the exhaust-purpose buffer chamber is provided from the lower portion to the upper portion of the side wall of the reaction tube, i.e., along the wafer arrangement region. In addition, FIG. 8A shows an example where the supply-purpose buffer chamber is partitioned into a plurality of (three) spaces, and the respective nozzles are disposed in the respective spaces. The arrangement of the three spaces of the buffer chamber is the same as the arrangement of the first to third nozzles. The spaces in which the first to third nozzles are disposed may also be referred to as first to third buffer chambers. The first nozzle and the first buffer chamber may be considered as a first supply part, the second nozzle and the second buffer chamber may be considered as a second supply part, and the third nozzle and the third buffer chamber may be considered as a third supply part. Furthermore, for example, as can be noted from the cross-sectional structure of the vertical process furnace shown in FIG. 8B, a buffer chamber may be provided in the same arrangement as FIG. 8A, a second nozzle may be provided in the buffer chamber, and first and third nozzles may be provided so as to sandwich the communication portion of the buffer chamber with the process chamber from both sides thereof and so as to extend along the inner wall of the reaction tube. The first nozzle may be considered as a first supply part, the second nozzle and the buffer chamber may be considered as a second supply part, and the third nozzle may be considered as a third supply part. The configurations other than the buffer chamber and the reaction tube described in FIGS. 8A and 8B are the same as the configurations of the respective parts of the process furnace shown in FIG. 1. Even in the case of using these process furnaces, it is possible to perform the cleaning processes in the process chamber and the supply parts (the nozzles and the buffer chamber) as the above-described embodiments. The same effects as those of the above-described embodiments may be obtained.

In the above-described embodiments, there has been described an example where a film is formed using a batch-type-substrate-processing apparatus that processes a plurality of substrates at a time. The present disclosure is not limited to the above-described embodiments, but may be suitably applied to, for example, a case where a film is formed using a single-wafer-type-substrate-processing apparatus that processes one or several substrates at a time. Furthermore, in the above-described embodiments, there has been described an example where a film is formed using a substrate-processing apparatus including a hot-wall-type process furnace. The present disclosure is not limited to the above-described embodiments, but may be suitably applied to a case where a film is formed using a substrate-processing apparatus including a cold-wall-type process furnace.

Even in the case of using these substrate-processing apparatuses, a substrate-processing process or a cleaning process can be performed under the same sequence and processing condition as those of the above-described embodiments and modification examples, and the same effects as those of the above-described embodiments and modification examples may be obtained.

In addition, the above-described embodiments and modification examples may be used in combination as appropriate. The processing procedure and processing condition at this time may be the same as, for example, the processing procedure and processing condition of the above-described embodiments.

According to the present disclosure in some embodiments, it is possible to improve the quality of a process of cleaning the interior of a supply part that supplies a processing gas to a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modification examples as would fall within the scope and spirit of the disclosures.

What is claimed is:

1. A method of cleaning an interior of a supply part, which includes a nozzle, by performing a cycle multiple times, the cycle including:
(a) supplying a first gas, which is one of a cleaning gas and an additive gas that reacts with the cleaning gas, via the nozzle toward an interior of a process container in which a substrate has been processed by supplying a processing gas from the supply part to the substrate;
(b) supplying a second gas, which is the other one of the cleaning gas and the additive gas and is different from the first gas, via the nozzle toward the interior of the process container in a state in which a part of the first gas remains in the supply part after supply of the first gas is stopped; and
(c) regulating a pressure in the process container to a predetermined processing pressure by supplying $N_2$ gas into the interior of the process container, and stopping the supply of the $N_2$ gas,
wherein (c) is performed before (a) and (b) in the cycle, and
wherein the part of the first gas remaining in the supply part after (a) and the second gas supplied into the supply part in (b) react with each other to thereby remove deposits adhering to the interior of the supply part.

2. The method according to claim 1, wherein (b) is performed in a state in which the interior of the process container is exhausted.

3. The method according to claim 1, wherein (b) is performed while moving the part of the first gas remaining in the supply part into the process container.

4. The method according to claim 1, wherein in (b), a concentration of the first gas in the supply part is decreased with a lapse of time.

5. The method according to claim 1, wherein in (b), a volume ratio of the second gas to the first gas in the supply part is increased with a lapse of time.

6. The method according to claim 1, wherein in (b), a peak point of a reaction between the first gas and the second gas in the supply part is moved.

7. The method according to claim 1, wherein in (b), a peak point of a generation amount of reaction heat generated by a reaction between the first gas and the second gas in the supply part is moved.

8. The method according to claim 1, wherein the cycle further includes:
(d) removing gas remaining in the supply part after supply of the second gas is stopped,
wherein in (d), gas remaining in the supply part and the process container is removed.

9. The method according to claim 1, wherein in (a), a pressure in the process container is regulated using the first gas, and the first gas is filled into the process container.

10. The method according to claim 1, wherein the first gas is the cleaning gas, and the second gas is the additive gas.

11. The method according to claim 1, wherein the first gas is the additive gas, and the second gas is the cleaning gas.

12. The method according to claim 1, wherein in (a), the second gas is supplied from an additional supply part, which includes an additional nozzle and is different from the supply part, toward the interior of the process container, and
wherein in (b), the first gas is supplied from the additional supply part toward the interior of the process container in a state in which a part of the second gas remains in the additional supply part after supply of the second gas is stopped.

13. The method according to claim 12, wherein the additional supply part is a supply part configured to supply the processing gas when the substrate is processed.

14. The method according to claim 1, wherein in (a), the first gas is supplied from an additional supply part, which includes an additional nozzle and is different from the supply part, toward the interior of the process container, and
wherein in (b), the second gas is supplied from the additional supply part toward the interior of the process container in a state in which a part of the first gas remains in the additional supply part after supply of the first gas is stopped.

15. The method according to claim 14, wherein the additional supply part is a supply part configured to supply the processing gas when the substrate is processed.

16. The method according to claim 1, wherein the cleaning gas includes a fluorine gas, a hydrogen fluoride gas, a chlorine fluoride gas, a nitrogen fluoride gas, or a mixed gas thereof, and the additive gas includes a nitrogen monoxide gas, a hydrogen gas, an oxygen gas, a nitrous oxide gas, an isopropyl alcohol gas, a methanol gas, a water vapor, a hydrogen fluoride gas, or a mixed gas thereof.

17. A method of manufacturing a semiconductor device, comprising:
   processing a substrate in a process container by supplying a processing gas from a supply part, which includes a nozzle, to the substrate; and
   cleaning an interior of the supply part after the substrate is processed,
   wherein in the act of cleaning the interior of the supply part, the interior of the supply part is cleaned by performing a cycle multiple times, the cycle including:
      (a) supplying a first gas, which is one of a cleaning gas and an additive gas that reacts with the cleaning gas, via the nozzle toward an interior of the process container;
      (b) supplying a second gas, which is the other one of the cleaning gas and the additive gas and is different from the first gas, via the nozzle toward the interior of the process container in a state in which a part of the first gas remains in the supply part after supply of the first gas is stopped; and
      (c) regulating a pressure in the process container to a predetermined processing pressure by supplying $N_2$ gas into the interior of the process container, and stopping the supply of the $N_2$ gas,
   wherein (c) is performed before (a) and (b) in the cycle, and
   wherein the part of the first gas remaining in the supply part after (a) and the second gas supplied into the supply part in (b) react with each other to thereby remove deposits adhering to the interior of the supply part.

18. A substrate-processing apparatus, comprising:
   a process container in which a substrate is processed;
   a supply part including a nozzle and configured to supply a processing gas into the process container;
   a cleaning gas supply system including a cleaning gas supply pipe and configured to supply a cleaning gas into the process container;
   an additive gas supply system including an additive gas supply pipe and configured to supply an additive gas that reacts with the cleaning gas into the process container; and
   a controller configured to control the cleaning gas supply system and the additive gas supply system such that an interior of the supply part is cleaned by performing a cycle multiple times, the cycle including:
      (a) supplying a first gas, which is one of the cleaning gas and the additive gas, via the nozzle toward an interior of the process container in which the substrate has been processed by supplying the processing gas from the supply part to the substrate;
      (b) supplying a second gas, which is the other one of the cleaning gas and the additive gas and is different from the first gas, via the nozzle toward the interior of the process container in a state in which a part of the first gas remains in the supply part after supply of the first gas is stopped; and
      (c) regulating a pressure in the process container to a predetermined processing pressure by supplying $N_2$ gas into the interior of the process container, and stopping the supply of the $N_2$ gas,
   wherein (c) is performed before (a) and (b) in the cycle, and
   wherein the part of the first gas remaining in the supply part after (a) and the second gas supplied into the supply part in (b) react with each other to thereby remove deposits adhering to the interior of the supply part.

19. A non-transitory computer-readable recording medium storing a program that causes, by a computer, a substrate-processing apparatus to perform a process of cleaning an interior of a supply part, which includes a nozzle, by performing a cycle multiple times, the cycle including:
   (a) supplying a first gas, which is one of a cleaning gas and an additive gas that reacts with the cleaning gas, via the nozzle toward an interior of a process container of the substrate-processing apparatus in which a substrate has been processed by supplying a processing gas from the supply part to the substrate;
   (b) supplying a second gas, which is the other one of the cleaning gas and the additive gas and is different from the first gas, via the nozzle toward the interior of the process container in a state in which a part of the first gas remains in the supply part after supply of the first gas is stopped; and
   (c) regulating a pressure in the process container to a predetermined processing pressure by supplying $N_2$ gas into the interior of the process container, and stopping the supply of the $N_2$ gas,
   wherein (c) is performed before (a) and (b) in the cycle, and
   wherein the part of the first gas remaining in the supply part after (a) and the second gas supplied into the supply part in (b) react with each other to thereby remove deposits adhering to the interior of the supply part.

20. The method according to claim 8, wherein (a) is performed before (b) in the cycle, and
   wherein (b) is performed before (d) in the cycle.

* * * * *